(12) United States Patent
Miyatake et al.

(10) Patent No.: US 8,643,756 B2
(45) Date of Patent: Feb. 4, 2014

(54) SOLID-STATE IMAGE-SENSING DEVICE HAVING A PLURALITY OF CONTROLLED PIXELS, WITH EACH PIXEL HAVING A TRANSFER GATE SIGNAL THAT IS TERNARY-VOLTAGE SIGNAL SWITCHED AMONG THREE LEVELS, AND METHOD OF OPERATING SAME

(75) Inventors: Shigehiro Miyatake, Tokyo (JP); Tomokazu Kakumoto, Tokyo (JP)

(73) Assignee: Knoica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 13/488,057

(22) Filed: Jun. 4, 2012

(65) Prior Publication Data

US 2012/0235023 A1    Sep. 20, 2012

Related U.S. Application Data

(62) Division of application No. 11/167,855, filed on Jun. 27, 2005, now Pat. No. 8,218,042.

(30) Foreign Application Priority Data

Jul. 5, 2004 (JP) ................................. 2004-198114
Mar. 31, 2005 (JP) ................................. 2005-100432

(51) Int. Cl.
*H04N 5/335* (2011.01)
(52) U.S. Cl.
USPC .......................................................... 348/308
(58) Field of Classification Search
USPC .......................................................... 348/308
See application file for complete search history.

(56) References Cited

U.S. PATENT DOCUMENTS

| | | |
|---|---|---|
| 6,486,503 B1 | 11/2002 | Fossum |
| 6,667,768 B1 | 12/2003 | Fossum |
| 6,707,499 B1 | 3/2004 | Kung et al. |
| 6,850,278 B1 | 2/2005 | Sakurai et al. |
| 6,927,884 B2 | 8/2005 | Takada et al. |
| 6,967,682 B1 | 11/2005 | Hagihara |
| 7,002,626 B2 | 2/2006 | Pain et al. |
| 7,030,921 B2 | 4/2006 | Hagihara et al. |
| 7,164,443 B1 | 1/2007 | Hagihara |
| 7,323,671 B1 | 1/2008 | Toros et al. |

(Continued)

FOREIGN PATENT DOCUMENTS

| | | |
|---|---|---|
| JP | 5-335547 | 12/1993 |
| JP | 5-336453 | 12/1993 |

(Continued)

OTHER PUBLICATIONS

Japanese Notice of Reasons for Rejection dated Jan. 12, 2010, for counterpart Japanese Application No. 2005-100432, together with an English translation thereof.

(Continued)

*Primary Examiner* — Gary C Vieaux
(74) *Attorney, Agent, or Firm* — Cozen O'Connor

(57) ABSTRACT

By feeding an appropriate voltage as a signal φTX to a transfer gate TG, a MOS transistor T1 is operated in a threshold region. A potential linearly or natural logarithmically converted by a buried photodiode PD is transferred to an N-type floating diffusion layer FD so as to be fed out, as an image signal, via MOS transistors T3 and T4.

2 Claims, 23 Drawing Sheets

(56) References Cited

U.S. PATENT DOCUMENTS

| | | |
|---|---|---|
| 7,349,018 B2 | 3/2008 | Doering et al. |
| 7,443,427 B2 | 10/2008 | Takayanagi |
| 7,502,060 B2 | 3/2009 | Watanabe |
| 7,508,422 B2 | 3/2009 | Kamon et al. |
| 2004/0036784 A1 | 2/2004 | Bock |
| 2004/0196398 A1 | 10/2004 | Doering et al. |
| 2004/0227109 A1 | 11/2004 | Storm et al. |
| 2005/0052557 A1* | 3/2005 | Kusaka et al. ............ 348/308 |
| 2005/0083421 A1 | 4/2005 | Berezin et al. |

FOREIGN PATENT DOCUMENTS

| | | |
|---|---|---|
| JP | 9-252434 | 9/1997 |
| JP | 10-90058 | 4/1998 |
| JP | 11-313257 | 11/1999 |
| JP | 2000-260971 | 9/2000 |
| JP | 2001-175108 | 6/2001 |
| JP | 2001-339639 | 12/2001 |
| JP | 2002-77733 | 3/2002 |
| JP | 2002-300476 | 10/2002 |
| JP | 2003-18471 | 1/2003 |
| JP | 2003-101881 | 4/2003 |
| JP | 2004-48813 | 2/2004 |
| JP | 2004-173216 | 6/2004 |
| JP | 2004-214772 | 7/2004 |

OTHER PUBLICATIONS

Japanese Notice of Reasons for Rejection dated May 11, 2010, for counterpart Japanese Application No. 2005-100432, together with an English translation thereof.

* cited by examiner

PRIOR ART

FIG.16
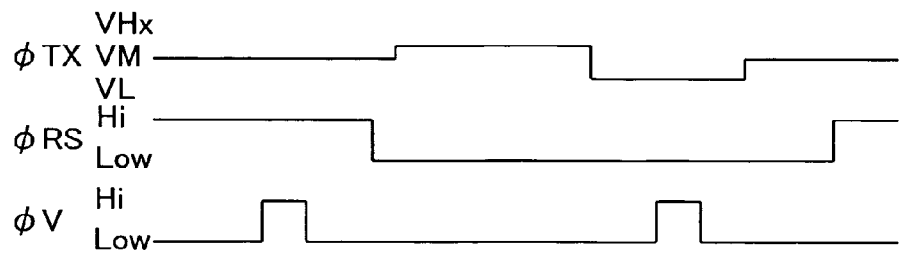
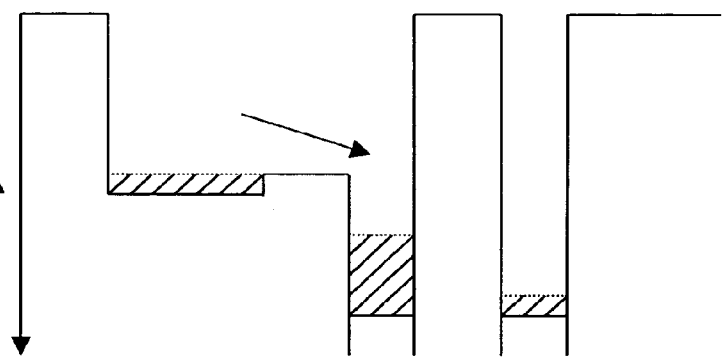
FIG.17A
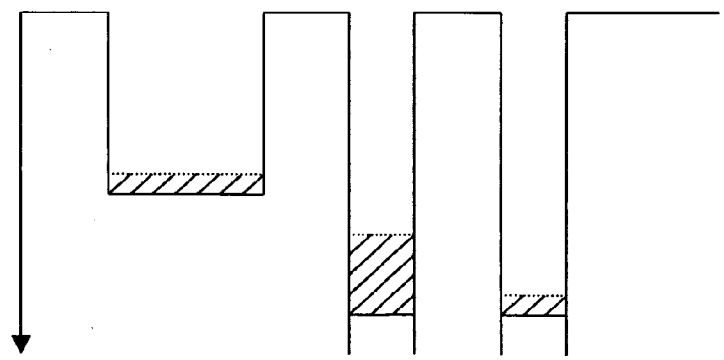
FIG.17B

SOLID-STATE IMAGE-SENSING DEVICE HAVING A PLURALITY OF CONTROLLED PIXELS, WITH EACH PIXEL HAVING A TRANSFER GATE SIGNAL THAT IS TERNARY-VOLTAGE SIGNAL SWITCHED AMONG THREE LEVELS, AND METHOD OF OPERATING SAME

This is a division of application Ser. No. 11/167,855, filed on Jun. 27, 2005, now U.S. Pat. No. 8,218,042, which claims priority on Japanese Patent Applications Nos. 2004-198114 and 2005-100432 filed on Jul. 5, 2004 and Mar. 31, 2005, respectively, the contents of which are hereby incorporated by reference.

BACKGROUND OF THE INVENTION

1. Field of the Invention

The present invention relates to a solid-state image-sensing device having pixels that output electric signals according to incident light, and to a camera provided with such a solid-state image-sensing device. More particularly, the present invention relates to a solid-state image-sensing device having pixels that are built with transistors, and to a camera provided with such a solid-state image-sensing device.

2. Description of Related Art

Solid-state image-sensing devices have been finding wide application. Such solid-state image-sensing devices are classified roughly into a CCD type and a CMOS type depending on how they read out (extract) the photoelectric charges generated in photoelectric conversion elements. In the CCD type, photoelectric charges are transferred while being accumulated in potential wells. This results in narrow dynamic ranges. On the other hand, in the CMOS type, electric charges accumulated in the pn-junction capacitors of photodiodes are read out directly via MOS transistors, and further MOS transistors for amplification are also incorporated in pixels.

Some conventional CMOS-type solid-state image-sensing devices perform logarithmic conversion by logarithmically converting the amount of incident light (see Japanese Patent Application Laid-open No. H11-313257). This type of solid-state image-sensing device has a dynamic range as wide as expressed with a five- to six-digit figure. Thus, even when a subject having a somewhat wider-then-usual brightness distribution is sensed, it is possible to output an electric signal into which all the brightness information within the brightness distribution has been converted. The problem here is that, since the shootable brightness range is now wider than the brightness distribution of the subject, in a low-brightness or high-brightness part of the shootable brightness range, there tends to appear a region where no brightness data is available.

In this context, the applicant of the present invention once proposed a CMOS-type solid-state image-sensing device whose operation can be switched between linear conversion for producing an electric signal that varies in a linear proportion to the amount of incident light and logarithmic conversion as described above (see Japanese Patent Application Laid-open No. 2002-77733). Moreover, to achieve automatic switching between linear conversion and logarithmic conversion, the applicant of the present invention once proposed a CMOS-type solid-state image-sensing device in which the transistors connected to photoelectric conversion photodiodes are brought into an appropriate potential state (see Japanese Patent Application Laid-open No. 2002-300476). The solid-state image-sensing device proposed in this publication, by permitting the potential state of the transistors to be changed, permits the inflection point across which their photoelectric conversion operation is switched between linear conversion and logarithmic conversion to be changed.

Other conventionally available solid-state image-sensing devices have pixels built with buried photodiodes PD as shown in FIG. 1. The pixel shown in FIG. 1 includes: a buried photodiode PD formed in a P-type well layer or a P-type substrate and composed of a P-type layer 10 and an N-type buried layer 11; a transfer gate TG formed, with an insulating layer 12 interposed, on the surface of a region adjacent to the region in which the buried photodiode PD is formed; and an N-type floating diffusion layer FD formed in a region adjacent to the region in which the transfer gate TG is formed.

In the buried photodiode PD, a high-density P-type layer 10 is formed on the surface of the N-type buried layer 11. The N-type buried layer 11, the N-type floating diffusion layer FD, and the transfer gate TG together form an N-channel MOS transistor T1. As the result of the buried photodiode PD being built within the pixel in this way, the potential at the surface of the P-type layer 10, which is part of the buried photodiode PD, is fixed at the same potential as the channel stopper layer formed by the P-type layer located around the buried photodiode PD.

The pixel shown in FIG. 1 further includes: an N-channel MOS transistor T2 that has the source thereof connected to the N-type floating diffusion layer FD and that receives at the drain thereof a direct-current voltage VPD; an N-channel MOS transistor T3 that has the gate thereof connected to the source of the MOS transistor T2 and that receives at the drain thereof the direct-current voltage VPD; and an N-channel MOS transistor T4 that has the drain thereof connected to the source of the MOS transistor T3 and that has the source thereof connected to an output signal line 4. Moreover, signals φTX, φRS, and φV are fed to the transfer gate TG, to the gate of the MOS transistor T2, and to the gate of the MOS transistor T4, respectively.

When the pixel shown in FIG. 1 is operated with the levels of the signals φTX, φRS, and φV shifted according to the timing chart shown in FIG. 29, it outputs a sensed-image signal, linearly converted, and a noise signal. Specifically, first, a high-level pulse is fed as the signal φRS to turn the MOS transistor T2 on, so that the N-type floating diffusion layer FD, which is connected to the drain of the MOS transistor T2, is reset. Then a high-level pulse is fed as the signal φV to turn the MOS transistor T4 on, so that a noise signal immediately after resetting is outputted.

Then, a high-level pulse is fed as the signal φTX to turn the transfer gate TG on, so that the photoelectric charge accumulated in the buried photodiode PD moves to the N-type floating diffusion layer FD. Thus, the potential at the N-type floating diffusion layer FD is commensurate with the amount of light incident on the buried photodiode PD, and accordingly a voltage commensurate with the integral of the amount of light incident on the buried photodiode PD appears at the gate of the MOS transistor T3. Then, a high-level pulse is fed as the signal φV to turn the MOS transistor T4 on, so that a linearly converted image signal is outputted.

As against a CMOS-type solid-state image-sensing device using conventional photodiodes, a solid-state image-sensing device having buried photodiodes PD built within pixels, like the one shown in FIG. 1, can suppress the dark currents that occur on the surface of the buried photodiodes, and can thus suppress the dark currents that occur within the pixels. Thus, with a solid-state image-sensing device having pixels configured as shown in FIG. 1, it is possible to reduce variations among the signals from the individual pixels.

Moreover, in a solid-state image-sensing device having pixels configured as shown in FIG. 1, the N-type floating diffusion layer FD, which performs sampling, is not shared as a photoelectric converter, and thus can be made accordingly small. This helps obtain a higher charge-to-voltage conversion ratio. Furthermore, by outputting image and noise signals as shown in FIG. 29 and using correlated double sampling, it is possible to eliminate the KTC noise in the N-type floating diffusion layer FD.

Disadvantageously, however, a solid-state image-sensing device having pixels configured as shown in FIG. 1 and driven according to the timing chart shown in FIG. 29, just like a CCD-type solid-state image-sensing device, outputs linearly converted image signals. Yielding, in this way, outputs proportional to the amounts of photoelectric charge generated in buried photodiodes results in a narrow dynamic range. On the other hand, in the CMOS-type solid-state image-sensing devices mentioned above, no mention is made of forming a floating diffusion layer. Thus, to realize simultaneous shuttering that permits individual pixels to perform image sensing simultaneously, it is necessary to provide each pixel with another MOS transistor for simultaneous shuttering. This complicates the circuit configuration of the pixel, and increases the pixel size, resulting in a lower aperture ratio.

SUMMARY OF THE INVENTION

In view of the conventionally encountered inconveniences discussed above, it is an object of the present invention to provide a low-noise, high-sensitivity, and wide-dynamic-range solid-state image-sensing device that is built with buried photodiodes. It is another object of the present invention to provide a solid-state image-sensing device that is built with buried photodiodes but that nevertheless permits simultaneous shuttering without unduly increasing the size of pixels.

To achieve the above objects, according to one aspect of the present invention, in a solid-state image-sensing device, a pixel is provided with: a buried photodiode that generates a photoelectric charge commensurate with the amount of incident light and then accumulates therewithin the resulting electric charge; a transfer gate that transfers the electric charge accumulated in the buried photodiode; a first floating diffusion layer that accumulates therewithin the electric charge transferred via the transfer gate from the buried photodiode; a reset gate that is connected to the first floating diffusion layer to permit the resetting thereof; an amplifier that is connected to the first floating diffusion layer; a read-out switch that permits an output signal amplified by the amplifier to be read out; and a transistor that has a first electrode, a second electrode, and a control electrode and that is so built that the second electrode thereof can be electrically connected to the buried photodiode. Here, the transistor operates in a subthreshold region at least in part of the brightness range of the light incident on the buried photodiode.

According to another aspect of the present invention, a camera is provided with: the solid-state image-sensing device described above; an optical system for directing light from a subject to the solid-state image-sensing device; a controller for controlling the solid-state image-sensing device; a signal processor for performing signal processing on the output of the solid-state image-sensing device; and an outputter for feeding out the output of the signal processor.

According to still another aspect of the present invention, a camera is provided with: the solid-state image-sensing device described above; and a mechanical shutter for controlling the incidence and shielding of light on and from the pixel. Here, the solid-state image-sensing device has a plurality pixels configured as described above, and, when the shutter is opened, in all the pixels, the transistor is driven so that all the pixels simultaneously perform image sensing.

According to the present invention, as a result of the transistor being operated in a subthreshold region at least in part of the subject brightness range, it is possible to obtain a wide dynamic range in a solid-state image-sensing device using buried photodiodes. This helps realize a high-sensitivity solid-state image-sensing device. Moreover, since the electric charge after image sensing can be held in the buried diode or in the floating diffusion layer based on the timing of the sequence of operations that take place in the buried diode, the transfer gate, the first floating diffusion layer, and the reset gate, it is possible to perform image sensing simultaneously. This eliminates the need for a device for simultaneous shuttering and hence for simultaneous image sensing, and thus helps eliminate the lowering of the aperture ratio as will be inevitable when such an extra device is provided.

BRIEF DESCRIPTION OF THE DRAWINGS

FIG. 16 is a timing chart showing the states of relevant signals in the solid-state image-sensing device of a third embodiment of the invention, illustrating a first example of the operation of the pixel thereof;

FIGS. 17A and 17B are diagrams showing the potential states of individual channels in the pixel shown in FIG. 1;

DETAILED DESCRIPTION OF PREFERRED EMBODIMENTS

Configuration of a Camera

Figure 28:
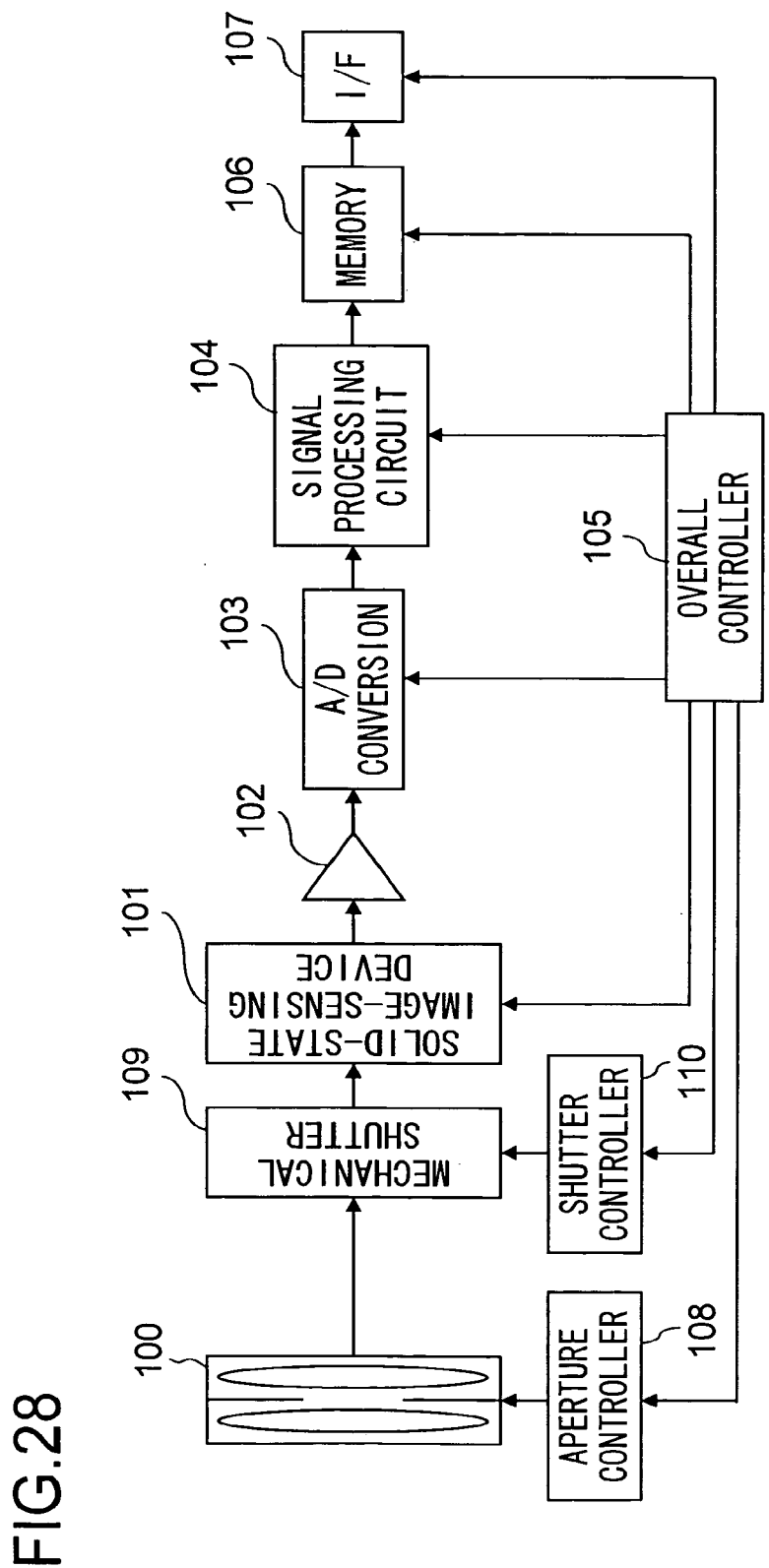
FIG. 28 is a diagram showing the internal configuration of a camera provided with the solid-state image-sensing device shown in FIG. 2.

First, a camera provided with a solid-state image-sensing device embodying the present invention will be described with reference to FIG. 28. FIG. 28 is a block diagram schematically showing the internal configuration of a camera embodying the invention The camera shown in FIG. 28 includes: an optical system 100 composed of a plurality of lenses; a solid-state image-sensing device 101 for converting the amount of light incident thereon through the optical system 100 into an electric signal; an output amplifier 102 for amplifying the electric signal outputted from the solid-state image-sensing device 101; an A/D conversion circuit 103 for converting the electric signal amplified by the output amplifier 102 into a digital signal; a signal processing circuit 104 for performing various kinds of signal processing, such as black level correction for setting the minimum level on the digital signal from the A/D conversion circuit 103, AE/WB evaluation value detection for detecting the evaluation values with reference to which to perform automatic exposure control (AE control) and white balance adjustment (WB adjustment), WB adjustment, color interpolation, color correction, gradation conversion, and coring; an overall controller 105 for controlling the individual blocks; a memory 106 for storing the image signal obtained through the signal processing performed by the signal processing circuit 104; an interface 107 for handling external output; an aperture controller 108 for controlling the amount of exposure obtained through an aperture stop provided in the optical system 100; a mechanical shutter 109 disposed between the optical system 100 and the solid-state image-sensing device 101; and a mechanical shutter controller 110 for controlling the mechanical shutter 109. In the camera configured as described above, if the releasing of a shutter can be achieved electronically within the solid-state image-sensing device 101, the mechanical shutter 109 and the mechanical shutter controller 110 may be omitted.

Configuration of a Solid-State Image Sensing Device

Figure 2:
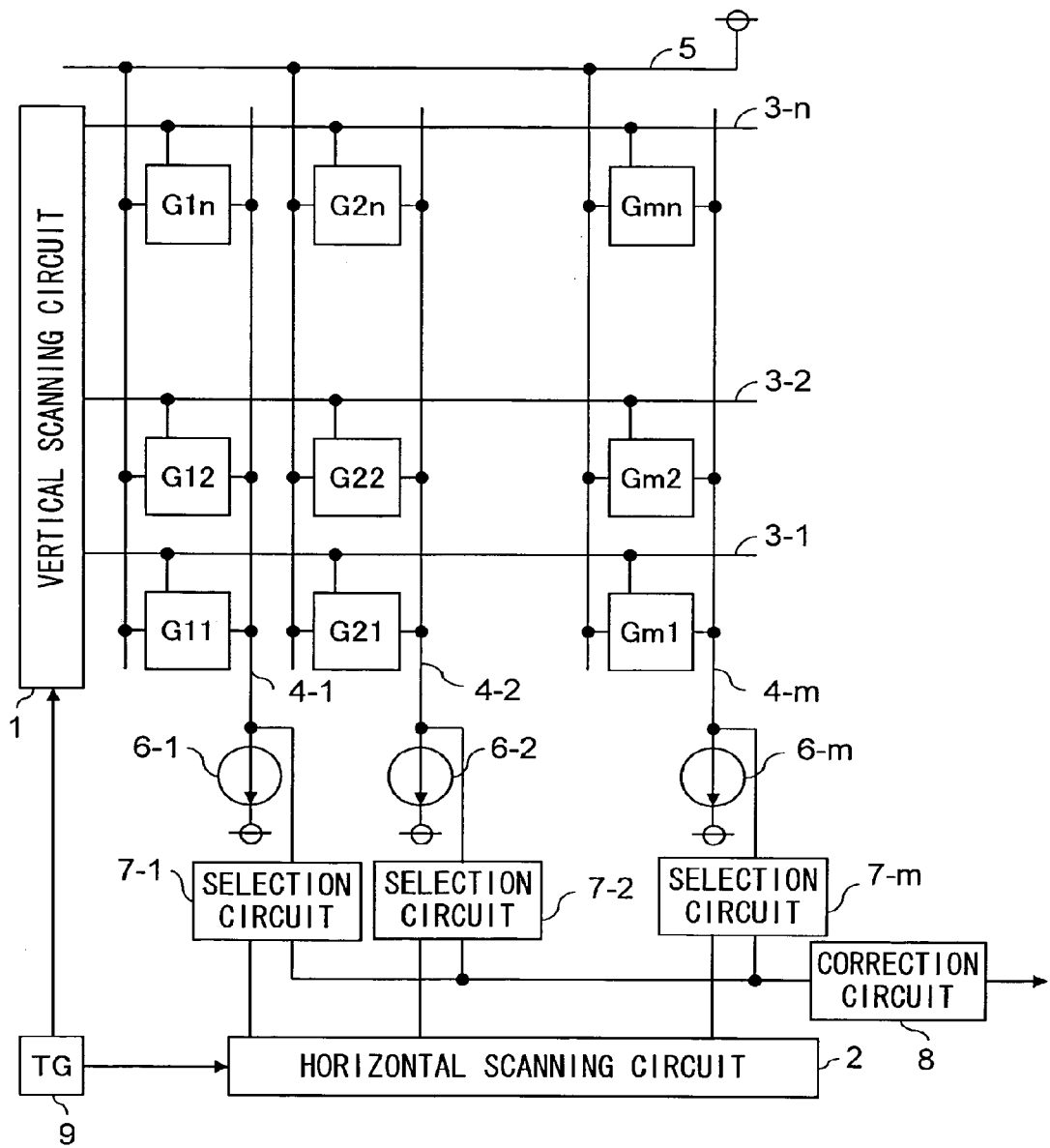
FIG. 2 is a diagram showing the configuration of a solid-state image-sensing device embodying the invention.

Next, the solid-state image-sensing device 101 provided in the camera described above in an embodiment of the invention will be described with reference to FIG. 2. FIG. 2 schematically shows the configuration of part of a two-dimensional CMOS solid-state image-sensing device embodying the invention.

In FIG. 2, G11 to Gmn represent pixels arrayed in rows and columns (arrayed in a matrix). Reference numeral 1 represents a vertical scanning circuit 1, which scans, one row after another, rows (lines) 3-1, 3-2, . . . , and 3-n via which a signal φV is fed to the individual pixels. Reference numeral 2 represents a horizontal scanning circuit 2, which reads, for one pixel after another in the horizontal direction, the photoelectric conversion signals delivered from the pixels to output signal lines 4-1, 4-2, . . . , and 4-m. Reference numeral 5 represents a power line. In reality, the pixels are connected not only to the lines already mentioned above, namely the lines 3-1 to 3-n, the output signal lines 4-1 to 4-m, and the power line 5, but also to other lines (for example, clock lines and bias feed lines); these other lines, however, are omitted in FIG. 2.

The output lines 4-1 to 4-m are connected respectively to constant current sources 6-1 to 6-m, and respectively to selection circuits 7-1 to 7-m, which sample-and-hold the image signals and noise signals fed thereto via the output lines 4-1 to 4-m from the pixels G11 to Gmn. When the image signals and noise signals are sequentially fed from the selection circuits 7-1 to 7-m to a correction circuit 8, the correction circuit 8 corrects them so that image signals having noise eliminated therefrom are fed out. The constant current sources 6-1 to 6-m receive, at one ends thereof, a direct-current voltage VPS.

A timing generator 9 is connected to the vertical and horizontal scanning circuits 1 and 2 so that, according to instructions from the timing generator 9, the vertical and horizontal scanning circuits 1 and 2, the selection circuits 7-1 to 7-m, and the correction circuit 8 operate with predetermined timing. The timing generator 9 may be formed on the same chip as the pixel portion by a CMOS process. Although not illustrated, a voltage controller or voltage regulator for feeding predetermined voltages to relevant parts may be additionally provided. In that case, the timing generator 9 together with the voltage controller or voltage regulator and the like may be provided separately from the solid-state image-sensing device 101.

In this solid-state image-sensing device 101, the image signal and noise signal outputted from the pixel Gab (where "a" is a natural number fulfilling 1≤a≤m and "b" is a natural number fulfilling 1≤b≤n) are fed out via the output signal line 4-*a*, and are amplified by the constant current source 6-*a* connected to that output signal line 4-*a*. Thus, the image signal and noise signal outputted from the pixel Gab are, one after the other, fed to the selection circuit 7-*a* so as to be sampled-and-held therein.

Thereafter, from the selection circuit 7-*a*, the image signal sampled-and-held therein is fed to the correction circuit 8, and then likewise the noise signal sampled-and-held therein is fed to the correction circuit 8. The correction circuit 8 corrects the image signal fed from the selection circuit 7-*a* on the basis of the noise signal likewise fed therefrom, and feeds out an image signal having noise eliminated therefrom. The selection circuits 7-1 to 7-*m* and the correction circuit 8 are configured, for example, as proposed in Japanese Patent Application Laid-open No. 2001-223948 by the applicant of the present invention. The correction circuit may be formed where the selection circuits 7-1 to 7-*m* are formed.

The configuration and operation described thus far are common to all the embodiments described below.

First Embodiment

Figure 1:
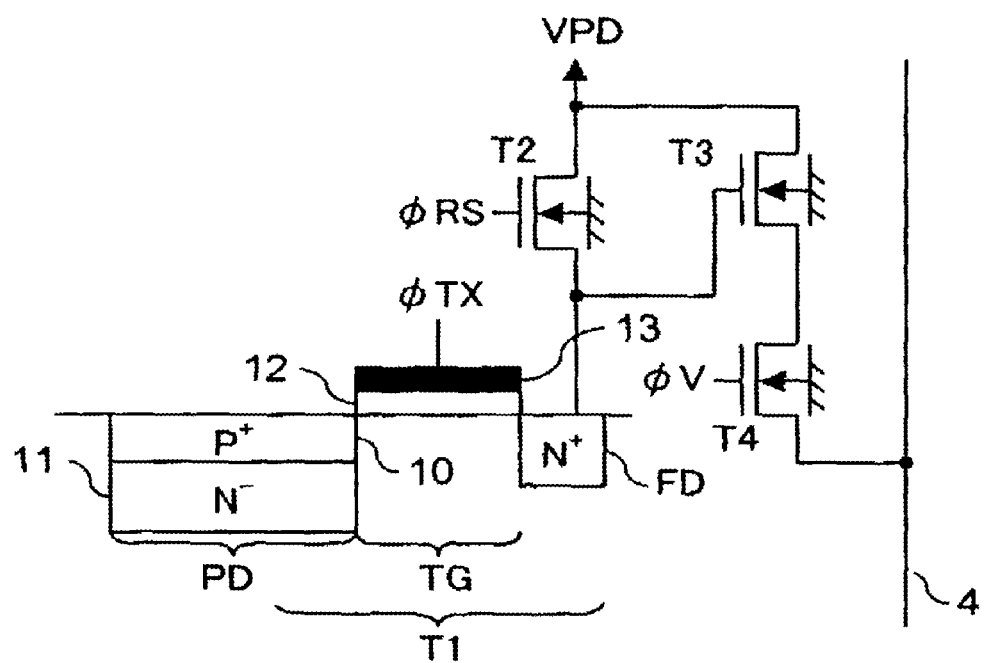
FIG. 1 is a diagram showing an example of the configuration of each pixel provided in a solid-state image-sensing device.
Figure 3:
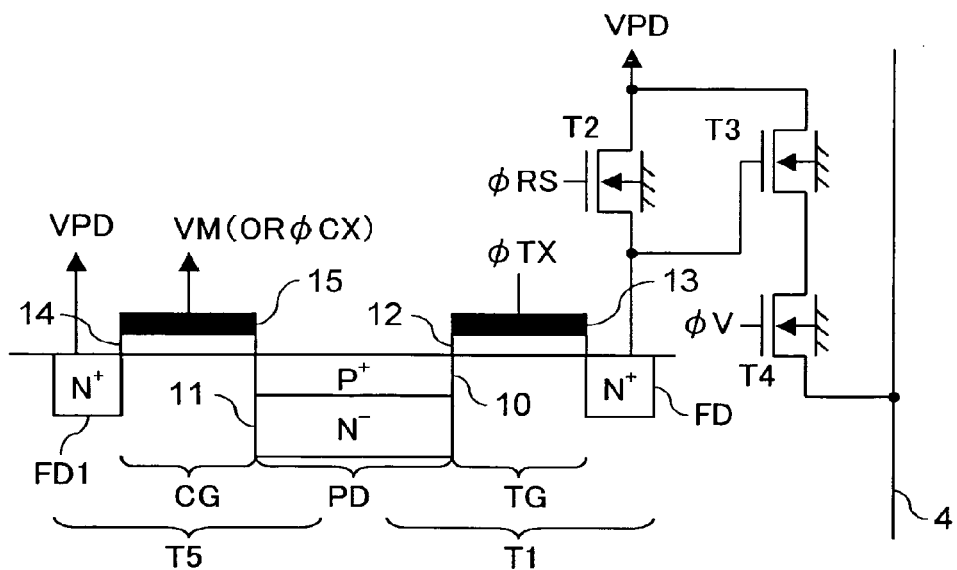
FIG. 3 is a diagram showing the configuration of each pixel provided in the solid-state image-sensing device of a first embodiment of the invention.

A first embodiment of the invention, which is applicable to each pixel provided in the solid-state image-sensing device 101 configured as shown in FIG. 2, will be described below with reference to the relevant drawings. FIG. 3 is a circuit diagram showing the configuration of each pixel of the solid-state image-sensing device of this embodiment. In the configuration shown in FIG. 3, such parts and elements as are found also in the pixel configuration shown in FIG. 1 are identified with common reference numerals and symbols, and their detailed explanations will not be repeated.

In the pixel shown in FIG. 3, a control gate CG is formed by forming a gate electrode 15, with an insulating film 14 interposed, on the surface of a region adjacent to the region in which a buried diode PD is formed that is formed with a P-type layer 10 and an N-type buried layer 11. Moreover, an N-type floating diffusion layer FD1 is formed in a region further adjacent to the region in which the control gate CG is formed. In other words, in a P-type well or a P-type substrate, with respect to a buried photodiode PD formed at the center, a transfer gate TG and a control gate CG are formed in symmetric positions, and N-type floating diffusion layers FD and FD1 are formed in symmetric positions.

A direct-current voltage VPD is applied to the N-type floating diffusion layer FD1, and a direct-current voltage VM lower than the direct-current voltage VPD is constantly applied to the control gate CG. The application of this direct-current voltage VM permits an N-channel MOS transistor T5, which is formed by the N-type floating diffusion layer FD1, the N-type buried layer 11 of the buried photodiode PD, and the control gate CG, to operate in a subthreshold region when the amount of photoelectric charge generated by the buried photodiode PD is larger than a predetermined value. In other words, the mode of conversion can be switched so that linear conversion is performed while the amount of incident light is smaller than or equal to a predetermined value and that logarithmic conversion is performed when the amount of incident light exceeds the predetermined value. By varying the direct-current voltage VM, it is possible to vary the inflection point across which the photoelectric conversion operation of the buried photodiode PD and the MOS transistor T5 is switched between linear conversion and logarithmic conversion. Now, examples of the operation of the pixel configured as described above will be described.

1. First Example of Operation

Figure 4:
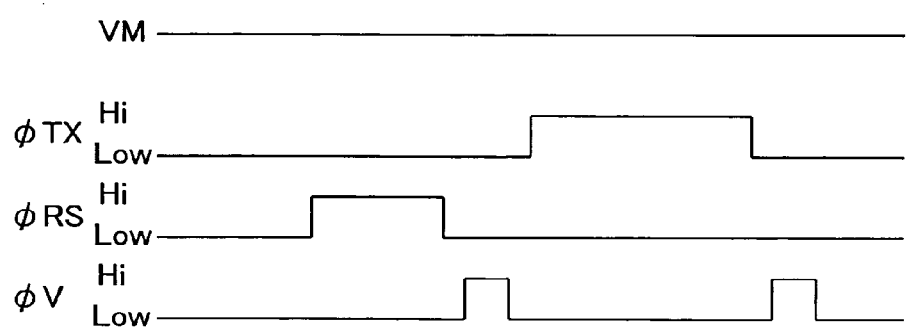
FIG. 4 is a timing chart showing the states of relevant signals in the solid-state image-sensing device of the first embodiment, illustrating a first example of the operation of the pixel thereof.

A first example of the operation of the pixel configured as shown in FIG. 3 will be described below with reference to FIGS. 4, 5A to 5C, 6A, and 6B. FIG. 4 is a timing chart showing the states of relevant signals in the solid-state image-sensing device of this embodiment, illustrating a first example of the operation thereof. FIGS. 5A to 5C, 6A, and 6B are diagrams showing the potential states of individual channels in the pixel of this embodiment. In this example of operation, a rolling shutter method is adopted, whereby image sensing (exposure) is performed sequentially for one row after another.

Figure 5A:
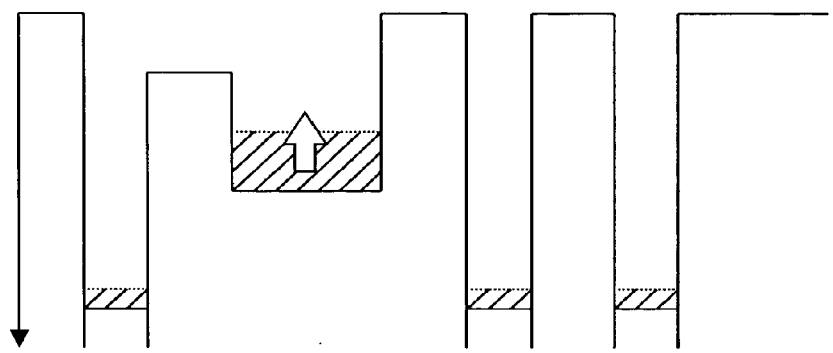
FIGS. 5A to 5C are diagrams showing the potential states of individual channels in the pixel shown in FIG. 3.

First, the signals φRS and φV are turned low to turn the MOS transistors T2 and T4 off. Here, the signal φTX is kept low so that, as shown in FIG. 5A, the potential at the transfer gate TG is kept at a low value. Moreover, an appropriate value (here, VM) between the potential at the buried photodiode PD and the potential at the transfer gate TG is applied to the control gate CG. When light is incident on the buried photodiode PD, an amount of photoelectric charge commensurate with the amount of incident light is generated and accumulated therein, causing the potential at the buried photodiode PD to change.

Figure 5B:
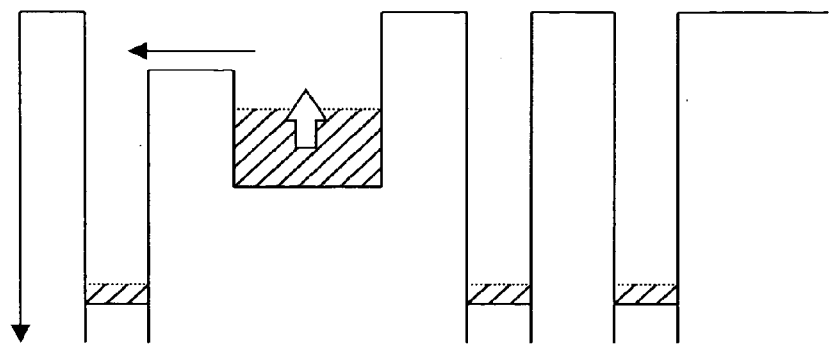

Here, if the brightness of the subject is low, the potential lowers by just the amount of photoelectric charge accumulated in the buried photodiode PD. That is, the potential appearing at the buried photodiode PD is linearly proportional to the integral of the amount of incident light. By contrast, if the brightness of the subject is high, when the potential at the buried photodiode PD lowers until its difference from the potential at the control gate CG is close to the threshold value, then, as shown in FIG. 5B, the MOS transistor T5 including the control gate CG operates in a subthreshold region, permitting a current to flow therethrough. Thus, the potential appearing at the buried photodiode PD now varies in proportion to the logarithm of the current generated as a result of photoelectric conversion.

Figure 5C:
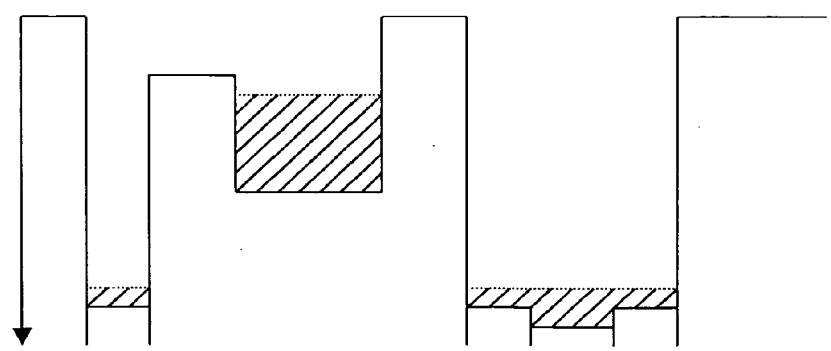

While photoelectric conversion is performed in the buried photodiode PD as described above, the signal φRS is turned high to turn the MOS transistor T2 on. This raises the potential at a reset gate RG, which is formed by the gate region of the MOS transistor T2, until, as shown in FIG. 5C, the potential becomes nearly equal to the direct-current voltage VPD. In this way, the potential at the N-type floating diffusion layer FD, which acts as the drain of the MOS transistor T1, is reset.

After the N-type floating diffusion layer FD is reset in this way, the signal φRS is turned low to turn the MOS transistor T2 off. Then, a high-level pulse is fed, as the signal φV, to the gate of the MOS transistor T4 to turn the MOS transistor T4 on. Then, a current commensurate with the potential appearing at the N-type floating diffusion layer FD is amplified by the MOS transistor T3, and is then outputted via the MOS transistor T4 to the output signal line 4. Here, since the MOS transistor T3 together with the constant current source 6-*k* (where k is a natural number fulfilling 1≤k≤m) forms a source follower circuit, a voltage signal commensurate with the current that flows through the MOS transistor T3 appears, as a noise signal, on the output signal line 4. This noise signal is then stored in the selection circuit 7-*k*.

Figure 6A:
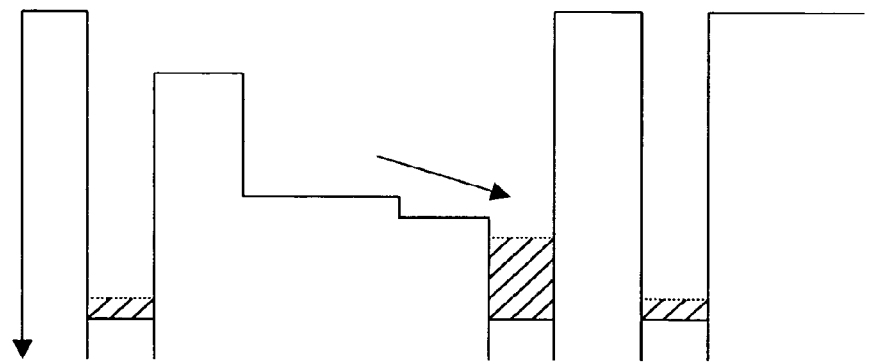
FIGS. 6A and 6B are diagrams showing the potential states of individual channels in the pixel shown in FIG. 3.

Then, the signal φV is turned low to turn the MOS transistor T4 off, and then the signal φTX is turned high to turn the MOS transistor T1 on. That is, the potential at the transfer gate TG is raised as shown in FIG. 6A so that the photoelectric charge accumulated in the buried photodiode PD is transferred to the N-type floating diffusion layer FD. As a result, the potential at the N-type floating diffusion layer FD lowers to become equal to a value commensurate with the photoelectric charge generated and accumulated in the buried photodiode PD (i.e., the potential at the buried photodiode PD).

Figure 6B:
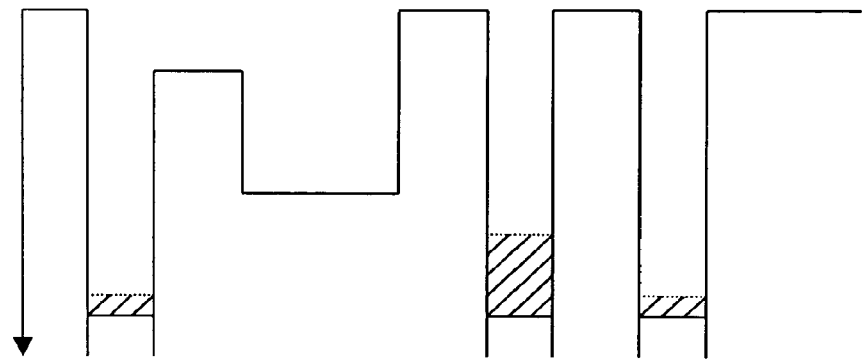

Thereafter, the signal φTX is turned low to lower the potential at the transfer gate TG as shown in FIG. 6B so that the transfer of the photoelectric charge from the buried photodiode PD is inhibited and the potential at the buried photodiode PD is held in the N-type floating diffusion layer FD. After the potential at the N-type floating diffusion layer FD is converted into a potential commensurate with the amount of light incident on the buried photodiode PD in this way, a high-level pulse is fed, as the signal φV, to the gate of the MOS transistor T4, so that a voltage signal commensurate with the amount of incident light is outputted, as an image signal, to the output signal line 4.

That is, a voltage obtained by linearly or logarithmically converting the amount of incident light is fed to the gate of the MOS transistor T3, and a current commensurate with that voltage flows from the MOS transistor T3 via the MOS transistor T4 to the output signal line 4, with the result that an image signal obtained by linearly or logarithmically converting the amount of incident light is outputted. Moreover, when the signal φTX is turned low and the potential state shown in FIG. 6B is established, the photoelectric charge in the buried photodiode PD is inhibited from being transferred to the N-type floating diffusion layer FD, and the next session of image sensing is started so that the photoelectric charge generated in the buried photodiode PD is accumulated.

The above-described sequence of operations is performed simultaneously for all the pixels arranged in a row, and the same sequence is repeated for one row after another so as to obtain an image corresponding to one frame. In this example, the noise signal is read out before the image signal is read out. This makes it possible to calculate the difference between those signals and thereby produce an image signal having KTC noise eliminated therefrom.

2. Second Example of Operation

Figure 7A:
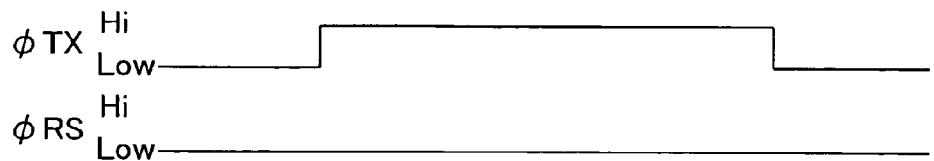
FIGS. 7A and 7B are timing charts showing the states of relevant signals in the solid-state image-sensing device of the first embodiment, illustrating a second example of the operation of the pixel thereof.
Figure 7B:
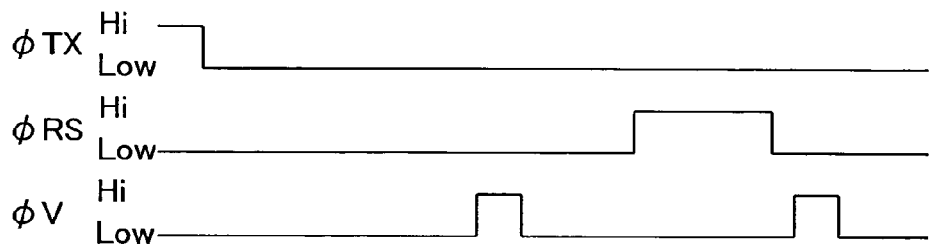

A second example of the operation of the pixel configured as shown in FIG. 3 will be described below with reference to FIGS. 5A to 5C, 6A, 6B, 7A, and 7B. FIGS. 7A and 7B are timing charts showing the states of relevant signals in the solid-state image-sensing device of this embodiment, illustrating a second example of the operation thereof. In this example of operation, a global shutter method is adopted, whereby exposure is performed simultaneously for all the pixels of one entire frame.

First, with reference to FIG. 7A, the level shifts of relevant signals as observed when image sensing is performed in all the pixels during a vertical blanking period will be described. Here, the signals φRS and φTX are fed with identical timing as shown in FIG. 7A to all the pixels provided in the solid-state image-sensing device. First, the signals φTX and φRS are turned low to turn the MOS transistors T1 and T2 off, so that the buried photodiode PD starts exposure. As a result, an amount of photoelectric charge commensurate with the amount of incident light is accumulated in the buried photodiode PD, and thus the potential thereat varies as shown in FIG. 5A or 5B.

Thereafter, the signal φTX is turned high to turn the MOS transistor T1 on, so that the photoelectric charge accumulated in the buried photodiode PD is transferred via the transfer gate TG to the N-type floating diffusion layer FD, with the result that, as shown in FIG. 6A, the potential at the N-type floating diffusion layer FD becomes equal to a potential commensurate with the amount of incident light. Then, the signal φTX is turned low to lower the potential at the transfer gate TG as shown in FIG. 6B so that the potential at the buried photodiode PD is held in the N-type floating diffusion layer FD. Moreover, when the signal φTX is turned low, the transfer of the photoelectric charge in the buried photodiode PD to the N-type floating diffusion layer FD is inhibited. This causes the buried photodiode PD to start exposure, and thus the next session of image sensing is started.

After image sensing is performed in all the pixels during a vertical blanking period in this way, with the result that, as shown in FIG. 6B, a potential commensurate with the amount of incident light is held in the N-type floating diffusion layer FD, then the levels of the signals φRS and φV, which are fed to one row after another of the solid-state image-sensing device, are shifted as shown in FIG. 7B during every horizontal blanking period, so that image signals and noise signals are outputted sequentially with respect to one row after another. Here, when the image signals and noise signals are red out, the signal φTX is kept low. Meanwhile, first, a high-level pulse is fed, as the signal φV, to the gate of the MOS transistor T4 so that a voltage signal commensurate with the amount of incident light is outputted, as an image signal, to the output signal line 4.

Thereafter, the signal φV is turned low, and the signal φRS is turned high to turn the MOS transistor T2 on so that the electric charge accumulated in the N-type floating diffusion layer FD is recombined and thereby, as shown in FIG. 5C, the potential at the N-type floating diffusion layer FD is initialized. Then, the signal φRS is turned low, and then the pulse signal φV is turned high to turn the MOS transistor T4 on, so that a voltage signal commensurate with the initialized potential at the N-type floating diffusion layer FD is outputted, as a noise signal, to the output signal line 4. As described above, in this example, global shuttering is achieved electronically without the need for a mechanical means such as a mechanical shutter 109.

3. Third Example of Operation

Figure 8A:
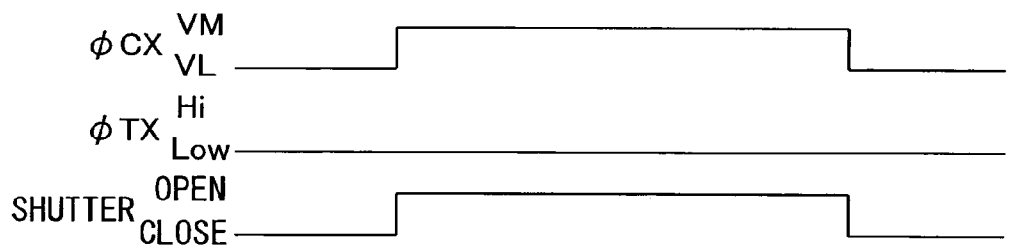
FIGS. 8A and 8B are timing charts showing the states of relevant signals in the solid-state image-sensing device of the first embodiment, illustrating a third example of the operation of the pixel thereof.
Figure 8B:
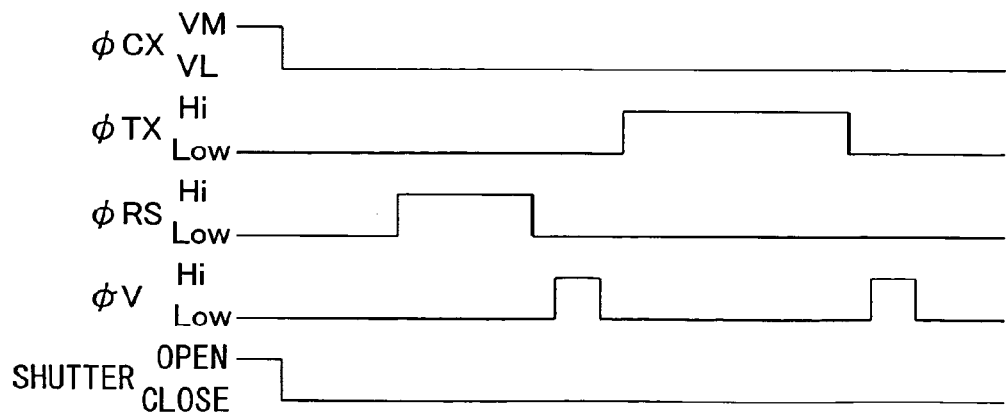

A third example of the operation of the pixel configured as shown in FIG. 3 will be described below with reference to FIGS. 5A to 5C, 8A, 8B, and 9A to 9D. FIGS. 8A and 8B are timing charts showing the states of relevant signals in the solid-state image-sensing device of this embodiment, illustrating a third example of the operation thereof. FIGS. 9A to 9D are diagrams showing the potential states of individual channels in the pixel of this embodiment.

Figure 29:
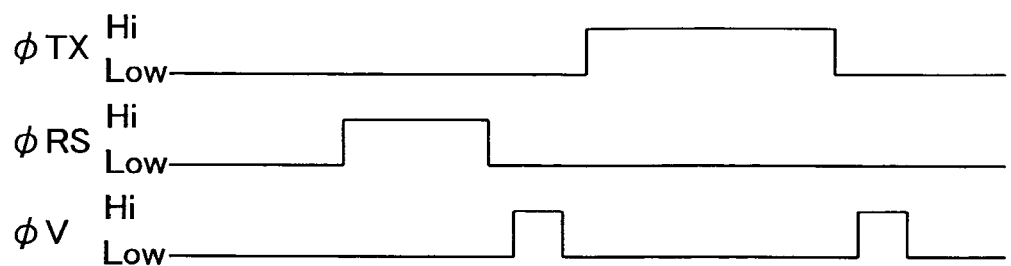
FIG. 29 is a timing chart showing the states of relevant signals in a conventional solid-state image-sensing device, illustrating the operation of the pixel thereof.

In this example of operation, a global reset method is adopted, whereby exposure is performed simultaneously in all the pixels corresponding to one entire frame by combined use of a mechanical shutter 109 (FIG. 29). Specifically, in this example of operation, the mechanical shutter controller 110 controls the releasing and closing of the mechanical shutter 109, and thereby controls whether to make light incident on or shielded from the solid-state image-sensing device. In this example of operation, as against the first and second examples of operation described above, the control gate CG is fed with a signal φCX. This ignal φCX is a binary voltage that is switched between a voltage VL equal to the low level of the other signals and the voltage VM mentioned above.

First, with reference to FIG. 8A, the level shifts of relevant signals as observed when image sensing is performed in all the pixels during a vertical blanking period will be described. Here, the signals φCX and φTX are fed with identical timing as shown in FIG. 8A to all the pixels provided in the solid-state image-sensing device. First, the signal φTX is turned low, and the level of the signal φCX is turned to VL to turn the MOS transistors T1 and T5 off. Then, the mechanical shutter 109 is released to let external light be incident on the solid-state image-sensing device, and simultaneously the level of the φCX is turned from VL to VM, so that the buried photodiode PD starts exposure. As a result, an amount of photoelectric charge commensurate with the amount of incident light is accumulated in the buried photodiode PD, and thus the potential thereat varies as shown in FIG. 5A or 5B.

Thereafter, when a predetermined period elapses after the start of exposure, the mechanical shutter 109 is closed to shield external light so that no light is any longer incident on the solid-state image-sensing device, and simultaneously the level of the signal φCX is turned from VM to VL so that the transfer of the photoelectric charge generated in the buried photodiode PD to the N-type floating diffusion layer FD1 is inhibited. As a result, as shown in FIG. 9A, a potential commensurate with the amount of light with which exposure was achieved during the period in which the mechanical shutter 109 was open is held in the buried photodiode PD.

Figures 9A, 9B, 9C, 9D:
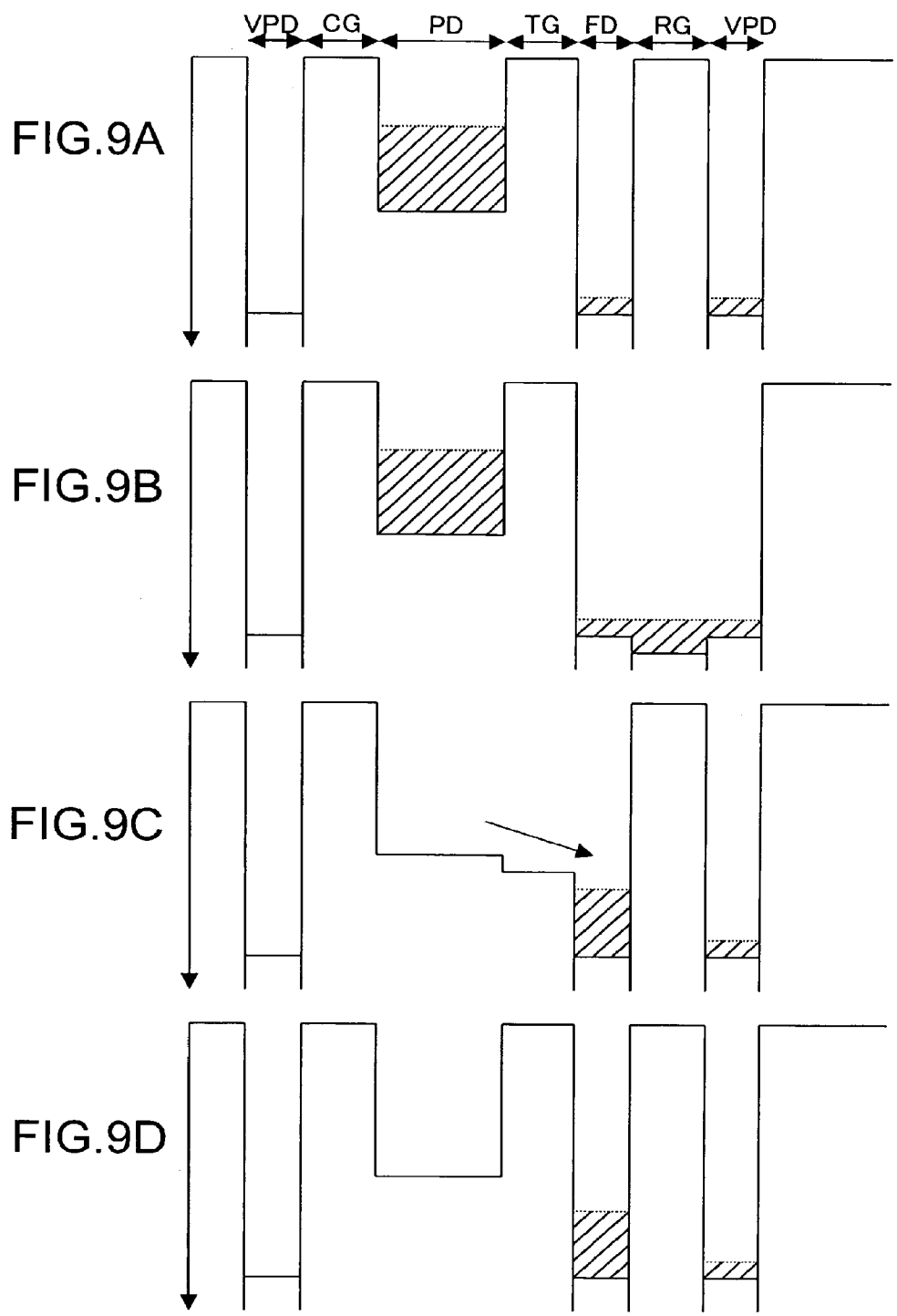
FIGS. 9A to 9D are diagrams showing the potential states of individual channels in the pixel shown in FIG. 3.

After image sensing is performed in all the pixels during a vertical blanking period in this way, with the result that, as shown in FIG. 9A, a potential commensurate with the amount of incident light is held in the buried photodiode PD, then the levels of the signals φTX, φRS, and φV, which are fed to one row after another of the solid-state image-sensing device, are shifted as shown in FIG. 8B during every horizontal blanking period, so that image signals and noise signals are outputted sequentially with respect to one row after another. Specifically, first, the signal φRS is turned high to turn the MOS transistor T2 on so that the electric charge accumulated in the N-type floating diffusion layer FD is recombined and thereby, as shown in FIG. 9B, the potential at the N-type floating diffusion layer FD is initialized.

After the potential at the N-type floating diffusion layer FD is initialized in this way, the signal φRS is turned low, and then a pulse is fed, as the signal φV, to the MOS transistor T4 to turn it on, so that a voltage signal commensurate with the initialized potential at the N-type floating diffusion layer FD is outputted, as a noise signal, to the output signal line 4. Thereafter, the signal φTX is turned on to turn the MOS transistor T1 on so that the photoelectric charge accumulated in the buried photodiode PD is transferred to the N-type floating diffusion layer FD, with the result that, as shown in FIG. 9C, the potential at the N-type floating diffusion layer FD becomes equal to a potential commensurate with the amount of incident light.

Then, the signal φTX is turned low to lower the potential at the transfer gate TG as shown in FIG. 9D so that the potential at the buried photodiode PD is held in the N-type floating diffusion layer FD. After the potential at the buried photodiode PD is held in the N-type floating diffusion layer FD in this way, a high-level pulse is fed, as the signal φV, to the gate of the MOS transistor T4, so that a voltage signal commensurate with the amount of incident light is outputted, as an image signal, to the output signal line 4.

With the configuration of this embodiment, the addition of one more MOS transistor makes it possible to perform image sensing while easily switching between linear operation and logarithmic operation. Thus, it is possible to realize a wide-dynamic-range solid-state image-sensing device without greatly changing the circuit configuration.

Second Embodiment

A second embodiment of the invention, which is applicable to each pixel provided in the solid-state image-sensing device 101 configured as shown in FIG. 2, will be described below with reference to the relevant drawings. In this embodiment, each pixel of the solid-state image-sensing device is configured as shown in FIG. 1. Specifically, the pixel of the solid-state image-sensing device of this embodiment, as compared with the pixel of the first embodiment, lacks the insulating film 14 and the gate electrode 15, which together form the control gate CG, and the N-type floating diffusion layer FD1, to which the direct-current voltage VPD is applied.

In each pixel of the solid-state image-sensing device of this embodiment, as against the timing chart in FIG. 29, the signal φTX, which is fed to the transfer gate TG, is not a binary-voltage signal switched between high and low levels but a ternary-voltage signal switched among three levels. In this embodiment, the levels corresponding to the high and low levels in the first embodiment are referred to as VH and VL, respectively, and a voltage between those levels VH and VL is referred to as VM. This level VM is equal to the level of the direct-current voltage VM that is fed to the control gate CG in the first embodiment. Thus, by appropriately setting the level VM of the signal φTX, it is possible to switch photoelectric conversion operation between linear conversion and logarithmic conversion according to the amount of incident light. Moreover, by varying the level VM of the signal φTX, it is possible to vary the inflection point across which the photoelectric conversion operation of the buried photodiode PD and the MOS transistor T1 is switched between linear conversion and logarithmic conversion. Now, examples of the operation of the pixel in the solid-state image-sensing device of this embodiment will be described.

1. First Example of Operation

Figure 10:
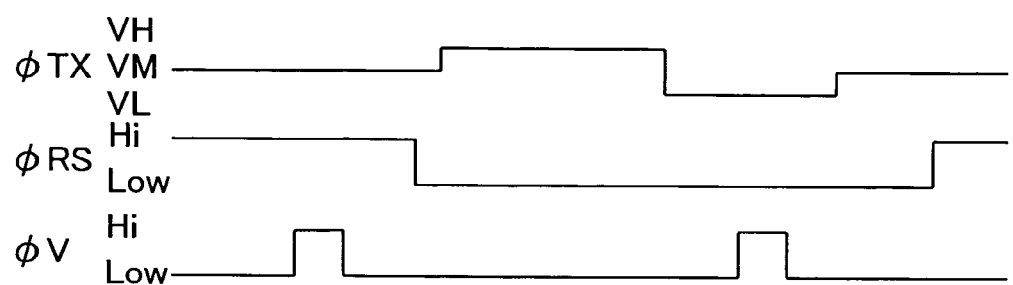
FIG. 10 is a timing chart showing the states of relevant signals in the solid-state image-sensing device of a second embodiment of the invention, illustrating a first example of the operation of the pixel thereof.

A first example of the operation of the pixel in the solid-state image-sensing device of this embodiment will be described below with reference to FIGS. 10, 11A to 11C, 12A and 12B. FIG. 10 is a timing chart showing the states of relevant signals in the solid-state image-sensing device of this embodiment, illustrating a first example of the operation thereof. FIGS. 11A to 11C, 12A, and 12B are diagrams showing the potential states of individual channels in the pixel of this embodiment. In this example of operation, a rolling shutter method is adopted, whereby exposure is performed sequentially for one row after another.

First, as in the first embodiment, the signal φV is turned low to turn the MOS transistor T4 off. Then, the level of the signal φTX is turned to VM, and in addition the signal φRS is turned high. This makes the potential at the transfer gate TG lower than the potential at the buried photodiode PD, and makes the potential at the N-type floating diffusion layer FD nearly equal, via the reset gate RG, to the potential of the direct-current voltage VPD. Incidentally, the potential that appears at the transfer gate TG is nearly equal to the potential that appears at the control gate CG in the first embodiment, and has a value between the potential at the buried photodiode PD and the potential at the reset gate RG.

Figure 11A:
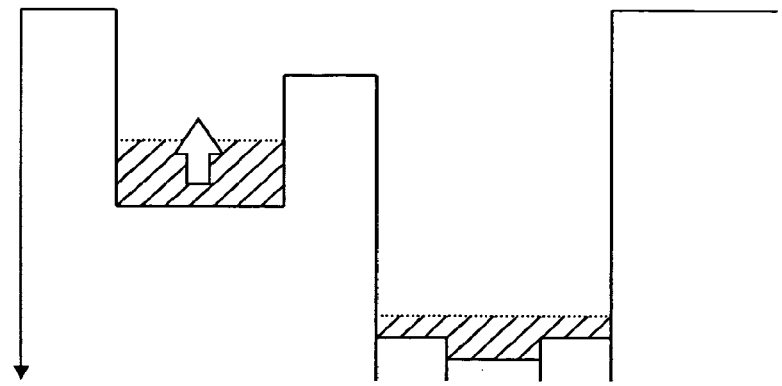
FIGS. 11A to 11C are diagrams showing the potential states of individual channels in the pixel shown in FIG. 1.
Figure 11B:
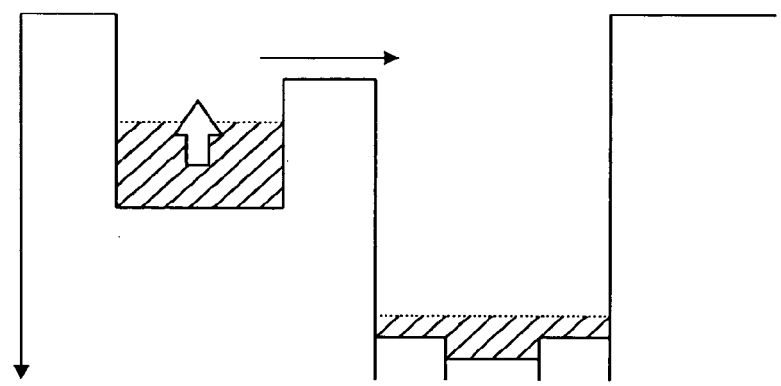

When light is incident on the buried photodiode PD, as in the first embodiment, an amount of photoelectric charge commensurate with the amount of incident light is generated and accumulated in the buried photodiode PD, causing the potential at the buried photodiode PD to change. Here, if the brightness of the subject is low, the photoelectric charge is accumulated in the buried photodiode PD so that, as shown in FIG. 11A, the potential at the buried photodiode PD varies in proportion to the integral of the amount of incident light. By contrast, when the brightness of the subject is high, when the potential at the buried photodiode PD lowers until its difference from the potential at the transfer gate TG is close to the threshold value, then, as shown in FIG. 11B, the MOS transistor T1 including the transfer gate TG operates in a sub-threshold region, permitting a current to flow therethrough. Thus, the potential appearing at the buried photodiode PD now varies in proportion to the logarithm of the current generated as a result of photoelectric conversion.

While photoelectric conversion is performed in the buried photodiode PD as described above, and while the signal φRS is kept high, a high-level pulse is fed, as the signal φV, to the gate of the MOS transistor T4 to turn the MOS transistor T4 on. Here, since the MOS transistor T2 is on, the potential at the N-type floating diffusion layer FD has been initialized. Thus, when the MOS transistor T4 is turned on, a voltage signal commensurate with the potential at the initialized N-type floating diffusion layer FD is outputted, as a noise signal, to the output signal line 4.

Figure 11C:
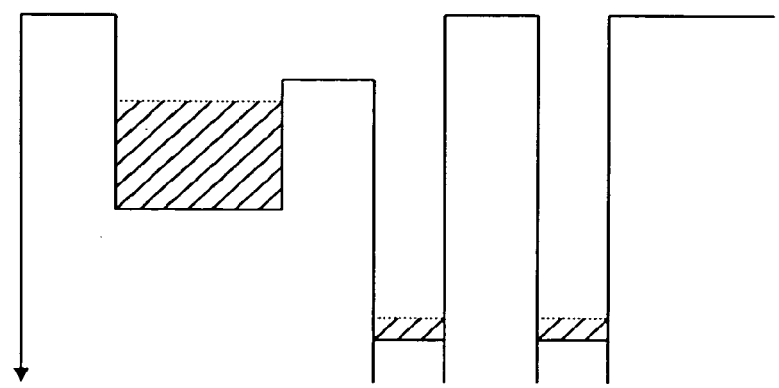
Figure 12A:
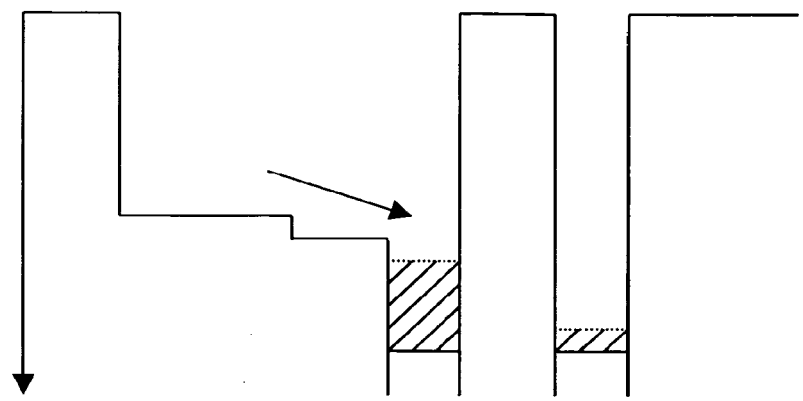
FIGS. 12A and 12B are diagrams showing the potential states of individual channels in the pixel shown in FIG. 1.

Then, the signal φV is turned low, and then the signal φRS is turned low to turn off the MOS transistor T2 so that, as shown in FIG. 11C, the potential at the N-type floating diffusion layer FD is brought into a floating state. Thereafter, the level of the signal φTX is turned to VH to raise the potential at the transfer gate TG as shown in FIG. 12A so that the potential accumulated in the buried photodiode PD is transferred to the N-type floating diffusion layer FD. Thus, the potential at the N-type floating diffusion layer FD becomes equal to a value commensurate with the potential at the buried photodiode PD.

Figure 12B:
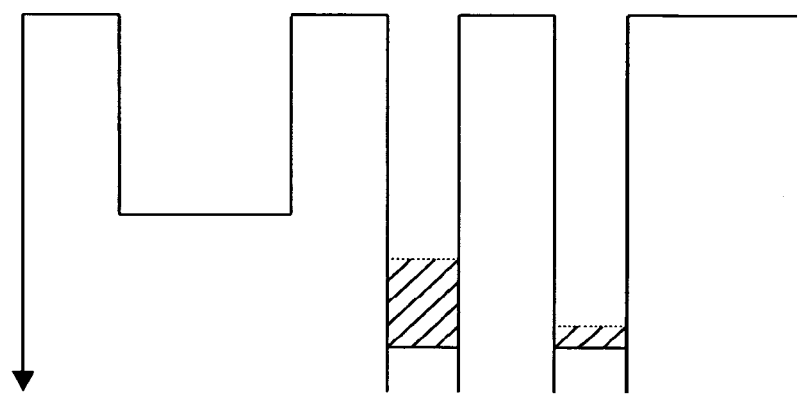

Then, the level of the signal φTX is turned to VL to lower the potential at the transfer gate TG as shown in FIG. 12B so that the transfer of the photoelectric charge from the buried photodiode PD is inhibited and the potential at the buried photodiode PD is held in the N-type floating diffusion layer FD. Thereafter, a high-level pulse is fed, as the signal φV, to the gate of the MOS transistor T4, so that a voltage signal commensurate with the amount of incident light is outputted, as an image signal, to the output signal line 4.

After the image signal is outputted in this way, the signal φV is turned low. Then, the level of the signal φTX is turned to VM, and then the signal φRS is turned high to turn the MOS transistor T2 on. In this way, the buried photodiode PD, the transfer gate TG, and the N-type floating diffusion layer FD are brought into the potential state shown in FIG. 11A, so that a next session of image sensing is started.

2. Second Example of Operation

Figure 13A:
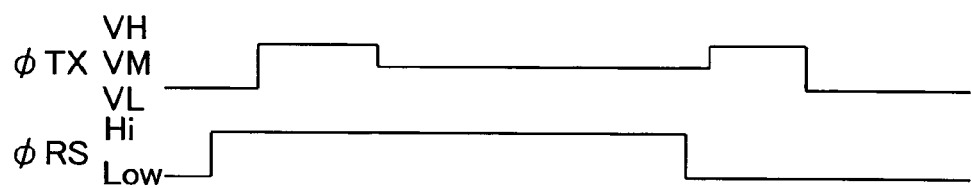
FIGS. 13A and 13B are timing charts showing the states of relevant signals in the solid-state image-sensing device of the second embodiment, illustrating a second example of the operation of the pixel thereof.
Figure 13B:
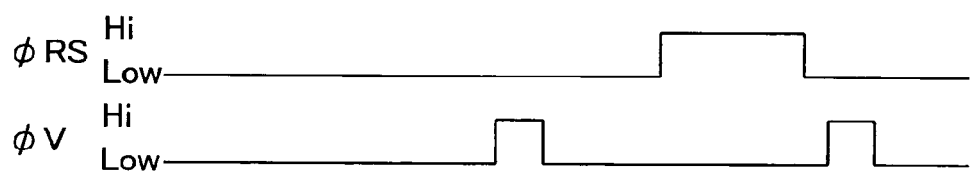
Figure 14A:
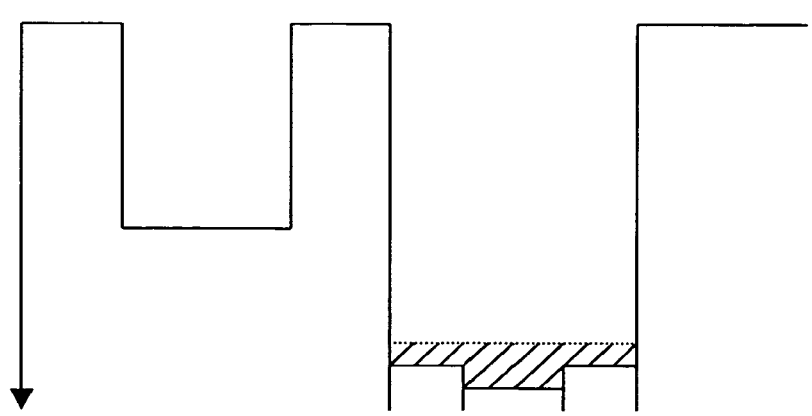
FIGS. 14A to 14C are diagrams showing the potential states of individual channels in the pixel shown in FIG. 1.
Figure 14B:
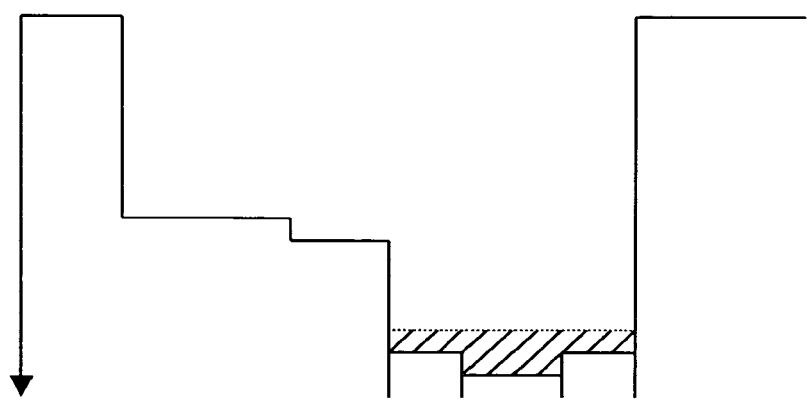
Figure 14C:
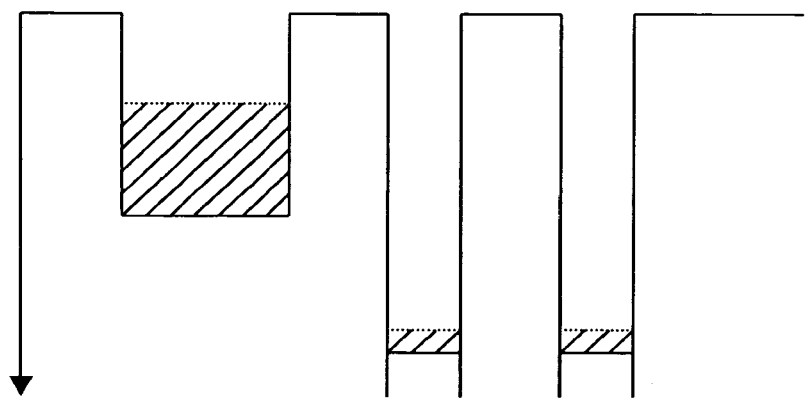

A second example of the operation of the pixel in the solid-state image-sensing device of this embodiment will be described below with reference to FIGS. 11A to 11C, 12A, 12B, 13A, 13B, and 14A to 14C. FIGS. 13A and 13B are timing charts showing the states of relevant signals in the solid-state image-sensing device of this embodiment, illustrating a second example of the operation thereof. FIGS. 14A to 14C are diagrams showing the potential states of individual channels in the pixel of this embodiment. In this example of operation, a global shutter method is adopted, whereby exposure is performed simultaneously for all the pixels of one entire frame.

First, with reference to FIG. 13A, the level shifts of relevant signals as observed when image sensing is performed in all the pixels during a vertical blanking period will be described. Here, the signals φRS and φTX are fed with identical timing as shown in FIG. 13A to all the pixels provided in the solid-state image-sensing device. First, the level of the signal φTX is turned to VL, and the signal φRS is turned low to turn the MOS transistors T1 and T2 off. Then, the signal φRS is turned high to turn the MOS transistor T2 on. This raises the potential at the reset gate RG as shown in FIG. 14A, so that the potential at the N-type floating diffusion layer FD is initialized.

Thereafter, the level of the φTX is turned to VH to raise the potential at the transfer gate TG as shown in FIG. 14B so that the potential at the buried photodiode PD is initialized. After the N-type floating diffusion layer FD and the buried photodiode PD are individually initialized in this way, the level of the signal φTX is turned to VM to bring the buried photodiode PD, the N-type floating diffusion layer FD, the transfer gate TG, and the reset gate RG into the potential state shown in FIG. 11A, so that the buried photodiode PD starts exposure.

Thus, an amount of photoelectric charge commensurate with the amount of incident light is accumulated in the buried photodiode PD, and thus, according to the accumulated electric charge, the potential at the buried photodiode PD changes as shown in FIG. 11A or 11B.

When a predetermined period elapses after exposure was started as described above, the signal φRS is turned low to turn the MOS transistor T2 off to lower the potential at the reset gate RG as shown in FIG. 11C, and in addition the level of the signal φTX is turned to VH to raise the potential at the transfer gate TG as shown in FIG. 12A. Thus, the photoelectric charge accumulated in the buried photodiode PD is transferred to the N-type floating diffusion layer FD, so that, as shown in FIG. 12A, the potential at the N-type floating diffusion layer FD becomes equal to a potential commensurate with the amount of incident light. Then, the level of the signal φTX is turned to VL to lower the potential at the transfer gate TG as shown in FIG. 12B so that the potential at the buried photodiode PD is held in the N-type floating diffusion layer FD.

After image sensing is performed in all the pixels during a vertical blanking period in this way, with the result that, as shown in FIG. 12B, a potential commensurate with the amount of incident light is held in the N-type floating diffusion layer FD, then the levels of the signals φRS and φV, which are fed to one row after another of the solid-state image-sensing device, are shifted as shown in FIG. 13B during every horizontal blanking period, so that image signals and noise signals are outputted sequentially with respect to one row after another. Here, when the image signals and noise signals are read out, the signal φTX is kept at VL. Meanwhile, as in the second example of operation in the first embodiment (see FIG. 7B), first, a high-level pulse is fed, as the signal φV, to the gate of the MOS transistor T4, so that an image signal is outputted. Then, the signal φRS is turned high so that the potential at the N-type floating diffusion layer FD is initialized, and then again a high-level pulse is fed, as the signal φV, to the gate of the MOS transistor T4 so that a noise signal is outputted.

3. Third Example of Operation

Figure 15A:
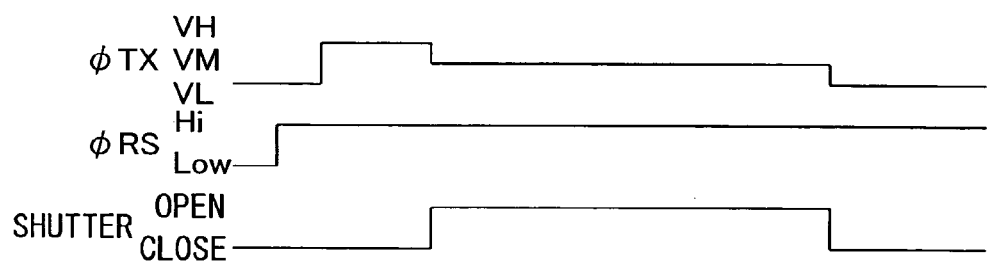
FIGS. 15A and 15B are timing charts showing the states of relevant signals in the solid-state image-sensing device of the second embodiment, illustrating a third example of the operation of the pixel thereof.
Figure 15B:
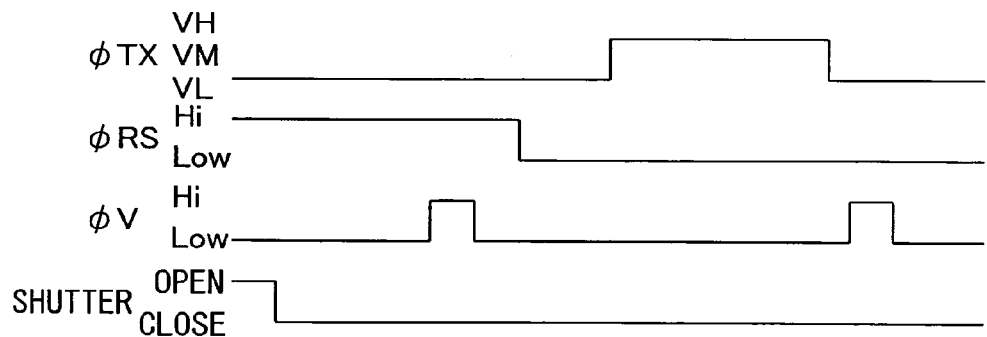

A third example of the operation of the pixel in the solid-state image-sensing device of this embodiment will be described below with reference to FIGS. 11A to 11C, 12A, 12B, 14A to 14C, 15A, and 15B. FIGS. 15A and 15B are timing charts showing the states of relevant signals in the solid-state image-sensing device of this embodiment, illustrating a third example of the operation thereof. In this example of operation, a global reset method is adopted, whereby exposure is performed simultaneously in all the pixels corresponding to one entire frame by combined use of a mechanical shutter 109 (FIG. 29).

First, with reference to FIG. 15A, the level shifts of relevant signals as observed when image sensing is performed in all the pixels during a vertical blanking period will be described. Here, the signals φRS and φTX are fed with identical timing as shown in FIG. 15A to all the pixels provided in the solid-state image-sensing device. First, the level of the signal φTX is turned to VL and the signal φRS is turned low to turn the MOS transistors T1 and T2 off, and in addition the mechanical shutter 109 is closed. Thereafter, the signal φRS is turned high to raise, the potential at the reset gate RG as shown in FIG. 14A, and then the level of the signal φTX is turned to VH to raise the potential at the transfer gate TG as shown in FIG. 14B. In this way, the N-type floating diffusion layer FD and the buried photodiode PD are individually initialized.

Then, the level of the signal φTX is turned to VM to bring the buried photodiode PD, the N-type floating diffusion layer FD, the transfer gate TG, and the reset gate RG into the potential state shown in FIG. 11A and in addition release the mechanical shutter 109. At the same time that the mechanical shutter 109 is in this way released to let external light be incident on the solid-state image-sensing device, the level of the signal φTX is turned to VM, so that the buried photodiode PD starts exposure. Thus, an amount of photoelectric charge commensurate with the amount of incident light is accumulated in the buried photodiode PD, and, according to the accumulated electric charge, the potential thereat changes as shown in FIG. 11A or 11B. When a predetermined period elapses after the start of exposure, the mechanical shutter 109 is closed to shield external light so that no light is any longer incident on the solid-state image-sensing device, and in addition the level of the signal φTX is turned to VL.

After image sensing is performed in all the pixels during a vertical blanking period in this way, the levels of the signals φTX, φRS, and φV, which are fed to one row after another of the solid-state image-sensing device, are shifted as shown in FIG. 15B during every horizontal blanking period, so that image signals and noise signals are outputted sequentially with respect to one row after another. Specifically, first, a high-level pulse is fed, as the signal φV, to the gate of the MOS transistor T4, so that a noise signal is outputted. Here, until the signal φV is turned high, the signal φRS remains high, and the level of the signal φTX remains at VL. Thereafter, the signal φRS is turned low to lower the potential at the reset gate RG as shown in FIG. 14C.

Next, the level of the signal φTX is turned to VH to raise the potential at the transfer gate TG as shown in FIG. 12A so that the potential at the N-type floating diffusion layer FD becomes equal to a potential commensurate with the amount of incident light. Then, the level of the signal φTX is turned to VL to lower the potential at the transfer gate TG as shown in FIG. 12B so that a potential commensurate with the amount of incident light is held in the N-type floating diffusion layer FD. When the potential commensurate with the amount of incident light is held in the N-type floating diffusion layer FD in this way, then a high-level pulse is fed, as the signal φV, to the gate of the MOS transistor T4, so that an image signal is outputted.

With the configuration of this embodiment, each pixel provided in the solid-state image-sensing device can be built with four MOS transistors, namely the MOS transistors T1 to T4. This helps reduce the circuit configuration and thereby increase the aperture ratio.

Third Embodiment

A third embodiment of the invention, which is applicable to each pixel provided in the solid-state image-sensing device 101 configured as shown in FIG. 2, will be described below with reference to the relevant drawings. In this embodiment, as in the second embodiment, each pixel of the solid-state image-sensing device is configured as shown in FIG. 1.

In each pixel of the solid-state image-sensing device of this embodiment, as in the second embodiment, the signal φTX, which is fed to the transfer gate TG, is a ternary-voltage signal switched among three levels. As against the second embodiment, however, the level that the signal φTX takes when it is fed to perform transfer is equal to a level VHx between the levels VH and VM. That is, in the second embodiment, when the photoelectric charge accumulated in the buried photodiode PD is transferred to the N-type floating diffusion layer FD, the potential at the buried photodiode PD is made, as shown in FIG. 12A, so high that the photoelectric charge accumulated in the buried photodiode PD is completely transferred to the N-type floating diffusion layer FD; by contrast, in this embodiment, the photoelectric charge accumulated in the buried photodiode PD is not completely transferred to the N-type floating diffusion layer FD, but part of the photoelectric charge is left in the buried photodiode PD when transfer is performed. Now, examples of the operation of the pixel in the solid-state image-sensing device of this embodiment will be described. For the reason stated above, the following description places focus on how transfer is performed.

1. First Example of Operation

A first example of the operation of the pixel in the solid-state image-sensing device of this embodiment will be described below with reference to FIGS. 11A to 11C, 16, 17A, and 17B. FIG. 16 is a timing chart showing the states of relevant signals in the solid-state image-sensing device of this embodiment, illustrating a first example of the operation thereof. FIGS. 17A and 17B are diagrams showing the potential states of individual channels in the pixel of this embodiment. In this example of operation, a rolling shutter method is adopted, whereby exposure is performed sequentially for one row after another.

First, as in the second embodiment, the level of the φTX is turned to VM, and the signal φRS is turned high to make the potential at the transfer gate TG lower than the potential at the buried photodiode PD as shown in FIG. 11A and to make the potential at the N-type floating diffusion layer FD nearly equal, via the reset gate RG, to the potential of the direct-current voltage VPD. Here, the potential Vtg1 at the transfer gate TG varies from one pixel to another, depending on the threshold value of the transfer gate TG.

In this state, light is incident on the buried photodiode PD, and thus a photoelectric charge is generated in the buried photodiode PD. Accordingly, when the incident light has low brightness, as shown in FIG. 11A, the potential at the buried photodiode PD varies linearly with respect to the integral of the amount of incident light. By contrast, when the incident light has high brightness, as shown in FIG. 11B, the potential that appears at the buried photodiode PD varies in proportion to the logarithm of the current generated as a result of photoelectric conversion. Here, when the pulse signal φV is turned high to turn the MOS transistor T4 on, a voltage signal commensurate with the initialized potential at the N-type floating diffusion layer FD is outputted, as a noise signal, to the output signal line 4.

Thereafter, the signal φRS is turned low to turn the MOS transistor T2 off to bring the potential at the N-type floating diffusion layer FD into a floating state as shown in FIG. 11C, and then the level of the signal φTX is turned from VM to VHx. When the level of the signal φTX is turned from VM to VHx in this way, the potential at the transfer gate TG is raised as shown in FIG. 17A so that the photoelectric charge accumulated at the buried photodiode PD is transferred to the N-type floating diffusion layer FD. Thus, the potential at the N-type floating diffusion layer FD becomes equal to a value commensurate with the potential at the buried photodiode PD. Here, the signal φTX has a level VHx lower than the level VH that the same signal has in the second embodiment.

Accordingly, the potential at the transfer gate TG shown in FIG. 17A is set lower than the potential at the buried photodiode PD as observed when the photoelectric charge is completely transferred in the second embodiment as shown in FIG. 12A. Thus, as shown in FIG. 17A, the buried photodiode PD has photoelectric charge accumulated therein up to the potential at the transfer gate TG. Here, the potential Vtg2 at the transfer gate TG, like the potential Vtg1 there observed when the level of the signal φTX is turned to VM for image sensing, varies from one pixel to another depending on the threshold value of the transfer gate TG.

Thus, in each pixel, the variation in the potential Vtg1 at the transfer gate TG at the time of image sensing is equal to the variation in the potential Vtg2 at the transfer gate TG at the time of transfer, and therefore the difference of the potential at the transfer gate TG between at the time of transfer and at the time of image sensing is equal in all the pixels G11 to Gmn. Thus, when the light incident on the pixels G11 to Gmn has equal brightness, the amount of photoelectric charge transferred from the buried photodiode PD to the N-type floating diffusion layer FD is equal in all the pixels G11 to Gmn. This makes it possible to eliminate, during transfer to the N-type floating diffusion layer FD, the fixed pattern noise (FPN) resulting from the variation of the threshold value of the transfer gate TG from one pixel to another.

After the potential at the N-type floating diffusion layer FD is made equal to a value commensurate with the potential at the buried photodiode PD in this way, the level of the signal φTX is turned to VL to lower the potential at the transfer gate TG as shown in FIG. 17B so that the transfer of the photoelectric charge from the buried photodiode PD is inhibited and that the potential at the buried photodiode PD is held in the N-type floating diffusion layer FD. Thereafter, a high-level is fed, as the signal φV, to the gate of the MOS transistor T4, so that a voltage signal commensurate with the amount of incident light is outputted, as an image signal, to the output signal line 4.

2. Second Example of Operation

Figure 18A:
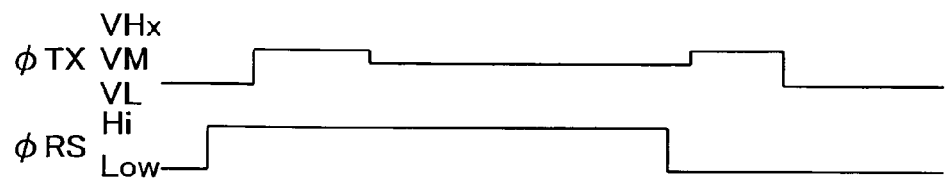
FIGS. 18A and 18B are timing charts showing the states of relevant signals in the solid-state image-sensing device of the third embodiment, illustrating a second example of the operation of the pixel thereof.
Figure 18B:
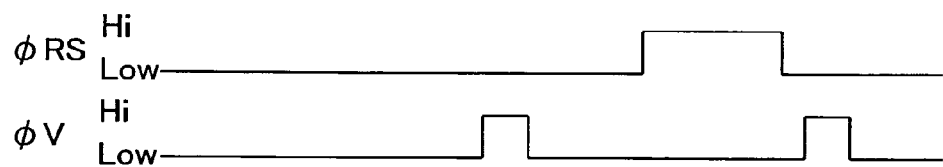
Figure 19:
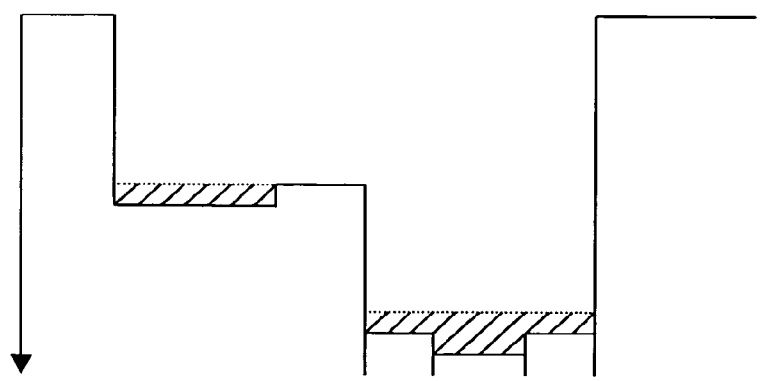
FIG. 19 is a diagram showing the potential states of individual channels in the pixel shown in FIG. 1.

A second example of the operation of the pixel in the solid-state image-sensing device of this embodiment will be described below with reference to FIGS. 11A to 11C, 14A to 14C, 17A, 17B, 18A, 18B, and 19. FIGS. 18A and 18B are timing charts showing the states of relevant signals in the solid-state image-sensing device of this embodiment, illustrating a second example of the operation thereof. FIG. 19 is a diagram showing the potential states of individual channels in the pixel of this embodiment. In this example of operation, a global shutter method is adopted, whereby exposure is performed simultaneously for all the pixels of one entire frame.

First, with reference to FIG. 18A, the level shifts of relevant signals as observed when image sensing is performed in all the pixels during a vertical blanking period will be described. Here, the signals φRS and φTX are fed with identical timing as shown in FIG. 18A to all the pixels provided in the solid-state image-sensing device. First, while the level of the signal φTX is at VL and the signal φRS is low, the signal φRS is turned high to raise the potential at the reset gate RG as shown in FIG. 14A so that the potential at the N-type floating diffusion layer FD is initialized.

Thereafter, the level of the signal φTX is turned to VHx to raise the potential at the TG as shown in FIG. 19 so that the potential at the buried photodiode PD is initialized. Here, as in the first example of operation, since the level of the signal φTX is at VHx, the potential Vtg2 at the transfer gate TG at this time has a value commensurate with the variation of the threshold value in each pixel. Thus, the buried photodiode PD has photoelectric charge accumulated therein up to the potential Vtg2 at the transfer gate TG. After the N-type floating diffusion layer FD and the buried photodiode PD are initialized in this way, the level of the signal φTX is turned to VM to establish a potential state as shown in FIG. 11A, so that the buried photodiode PD starts exposure. Thus, an amount of photoelectric charge commennsurate with the amount of incident light is accumulated in the buried photodiode PD, and, according to the accumulated electric charge, the potential thereat changes as shown in FIG. 11A or 11B.

When a predetermined period elapses after exposure was started as described above, the signal φRS is turned low to lower the potential at the reset gate RG as shown in FIG. 11C, and in addition the level of the signal φTX is turned to VHx to raise the potential at the transfer gate TG as shown in FIG. 17A so that, as in the first example of operation, the photoelectric charge accumulated in the buried photodiode PD is transferred to the N-type floating diffusion layer FD. Thus, as shown in FIG. 17A, the potential at the N-type floating diffusion layer FD becomes equal to a potential commensurate with the amount of incident light.

Then the level of the signal φTX is turned to VL to lower the potential at the transfer gate TG as shown in FIG. 17B so that the potential at the buried photodiode PD is held in the N-type floating diffusion layer FD. Here, since the potential Vtg2 at the transfer gate TG at the time of transfer is commensurate with the threshold value of the transfer gate TG, the potential at the buried photodiode PD as held in the N-type floating diffusion layer FD has, as described earlier in connection with the first example of operation, a value having the pixel-specific variation of the threshold value eliminated therefrom.

After image sensing is performed in all the pixels during a vertical blanking period in this way, with the result that, as shown in FIG. 17B, a potential commensurate with the amount of incident light is held in the N-type floating diffusion layer FD, then the levels of the signals φRS and φV, which are fed to one row after another of the solid-state image-sensing device, are shifted as shown in FIG. 18B during every horizontal blanking period, so that image signals and noise signals are outputted sequentially with respect to one row after another. How these image signals and noise signals are outputted sequentially with respect to one row after another is the same as in the second embodiment, and therefore, in this regard, no detailed explanations will be repeated.

3. Third Example of Operation

Figure 20A:
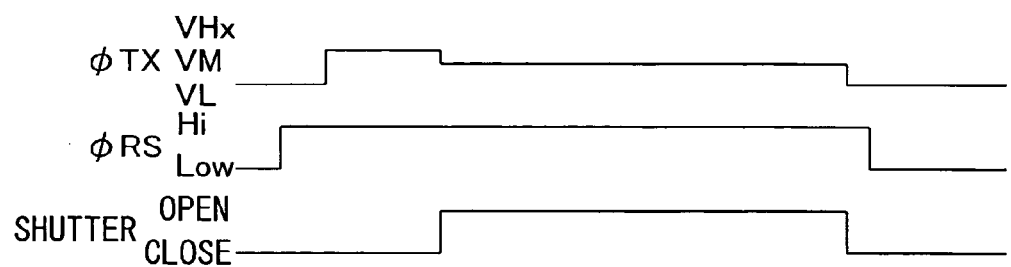
FIGS. 20A and 20B are timing charts showing the states of relevant signals in the solid-state image-sensing device of the third embodiment, illustrating a third example of the operation of the pixel thereof.
Figure 20B:
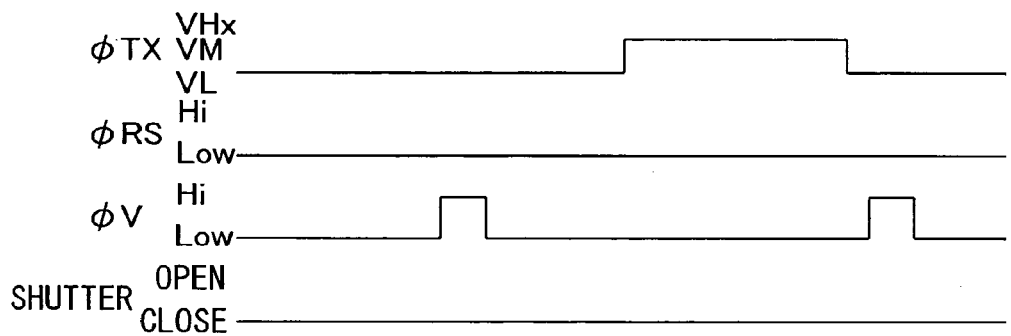

A third example of the operation of the pixel in the solid-state image-sensing device of this embodiment will be described below with reference to FIGS. 11A to 11C, 14A to 14C, 17A, 17B, 19, 20A, and 20B. FIGS. 20A and 20B are timing charts showing the states of relevant signals in the solid-state image-sensing device of this embodiment, illustrating a third example of the operation thereof. In this example of operation, a global reset method is adopted, whereby exposure is performed simultaneously in all the pixels corresponding to one entire frame by combined use of a mechanical shutter 109 (FIG. 29).

First, with reference to FIG. 20A, the level shifts of relevant signals as observed when image sensing is performed in all the pixels during a vertical blanking period will be described. Here, the signals φRS and φTX are fed with identical timing as shown in FIG. 20A to all the pixels provided in the solid-state image-sensing device. First, the level of the signal φTX is turned to VL, the signal φRS is turned low to, and in addition the mechanical shutter 109 is closed. Then, the signal φRS is turned high to raise the potential at the reset gate RG as shown in FIG. 14A so that the potential at the N-type floating diffusion layer FD is initialized.

Thereafter, as in the second example of operation, the level of the signal φTX is turned to VHx to raise the potential at the transfer gate TG as shown in FIG. 19 so that the buried photodiode PD is initialized. Then, the level of the signal φTX is turned to VM to establish a potential state as shown in FIG. 11A, and the mechanical shutter 109 is opened so that external light is incident on the solid-state image-sensing device. As a result, the buried photodiode PD starts exposure, and, according to the accumulated electric charge, the potential at the buried photodiode PD changes as shown in FIG. 11A or 11B.

When a predetermined period elapses after the start of exposure, the mechanical shutter 109 is closed to shield external light so that no light is any longer incident on the solid-state image-sensing device, and simultaneously the level of the signal φTX is turned to VL to end image sensing. Thereafter, as against the second embodiment, the signal φRS is turned low to lower the potential at the reset gate RG as shown in FIG. 14C. After image sensing is performed in all the pixels during a vertical blanking period in this way, the levels of the signals φTX, φRS, and φV, which are fed to one row after another of the solid-state image-sensing device, are shifted as shown in FIG. 20B during every horizontal blanking period, so that image signals and noise signals are outputted sequentially with respect to one row after another.

Here, as against the second embodiment, the signal φRS is kept low. Then, first, a high-level pulse is fed, as the signal φV, to the gate of the MOS transistor T4, so that a noise signal is outputted. Thereafter, the level of the signal φTX is turned to VHx to raise the potential at the transfer gate TG as shown in FIG. 17A so that the potential at the N-type floating diffusion layer FD becomes equal to a potential commensurate with the amount of incident light. Then, the level of the signal φTX is turned to VL to lower the potential at the transfer gate TG as shown in FIG. 17B so that a potential commensurate with the amount of incident light is held in the N-type floating diffusion layer FD. Then, a high-level pulse is fed, as the signal φV, to the gate of the MOS transistor T4, so that an image signal is outputted.

In this embodiment, when transfer or resetting is performed, the transfer gate TG is brought into a potential state that does not permit the photoelectric charge in the drain to be completely transferred. That is, the transfer gate TG is brought into a potential state that permits a slight portion of the photoelectric charge accumulated in the buried photodiode PD to remain therein. As a result, with respect to the potential state of the transfer gate TG at the time of image sensing, an equal variation is produced, based on the threshold value of the transfer gate TG, in the potential of the transfer gate TG at the time of transfer. Thus, the variation is canceled. In this way, it is possible to cancel pixel-specific variations contained in the image signals outputted from the solid-state image-sensing devices of the first and second embodiments.

Fourth Embodiment

Figure 21:
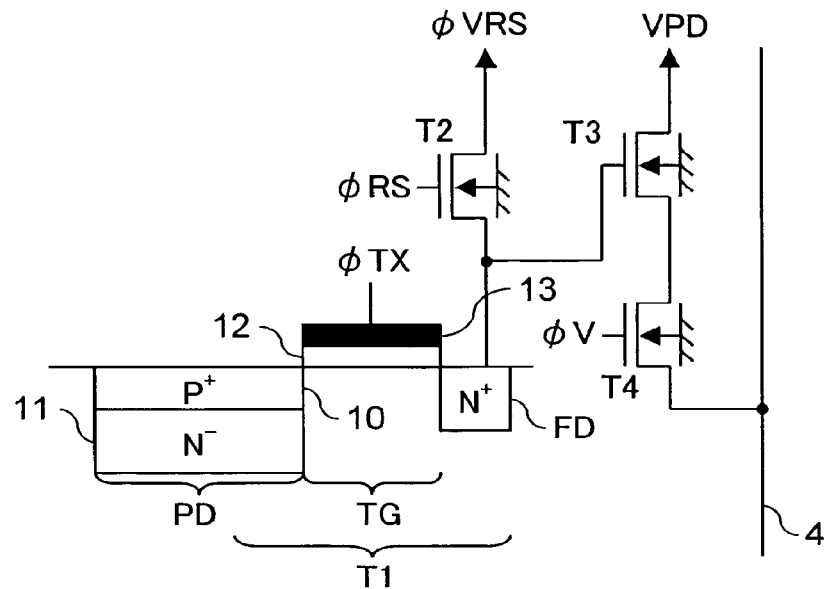
FIG. 21 is a diagram showing the configuration of each pixel provided in the solid-state image-sensing device of a fourth embodiment of the invention.

A fourth embodiment of the invention, which is applicable to each pixel provided in the solid-state image-sensing device 101 configured as shown in FIG. 2, will be described below with reference to the relevant drawings. FIG. 21 is a circuit diagram showing the configuration of each pixel of the solid-state image-sensing device of this embodiment. In the configuration shown in FIG. 21, such parts and elements as are found also in the pixel configuration shown in FIG. 1 are identified with common reference numerals and symbols, and their detailed explanations will not be repeated.

In each pixel provided in the solid-state image-sensing device of this embodiment, as against the second embodiment, the signal φTX, which is fed to the transfer gate TG, is a binary signal switched between high and low levels, and the signal φRS, which is fed to the reset gate RG, is not a binary signal switched between high and low levels but a ternary signal switched among levels VH, VM, and VL. The levels VH, VM, and VL in this embodiment are equivalent to the levels VH, VM, and VL in the second embodiment. Moreover, as against the second embodiment (FIG. 1), a signal φVRS is fed to the drain of the MOS transistor T2 as shown in FIG. 21. In other respects, the fourth embodiment is the same as the second embodiment.

When these signals φTX and φRS are fed in, as against the first and second embodiments, how each pixel performs photoelectric conversion is determined according to the potential state of the MOS transistor T2. Thus, by appropriately setting the level VM of the signal φRS, it is possible to switch photoelectric conversion operation between linear conversion and logarithmic conversion. Moreover, by varying the level VM of the signal φRS, it is possible to vary the inflection point across which the photoelectric conversion operation of the buried photodiode PD and the MOS transistors T1 and T2 is switched between linear conversion and logarithmic conversion. Now, an example of the operation of the pixel in the solid-state image-sensing device of this embodiment will be described.

Figure 22A:
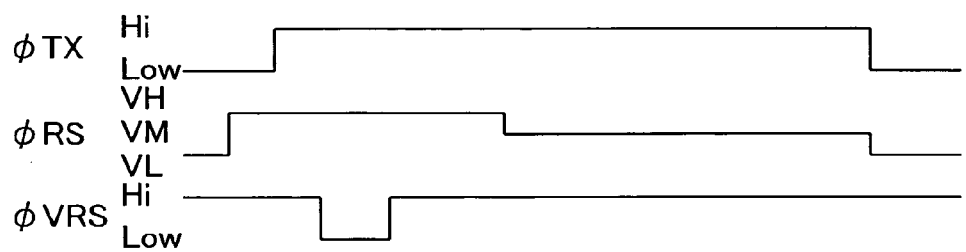
FIGS. 22A and 22B are timing charts showing the states of relevant signals in the solid-state image-sensing device of the fourth embodiment, illustrating an example of the operation of the pixel thereof.
Figure 22B:
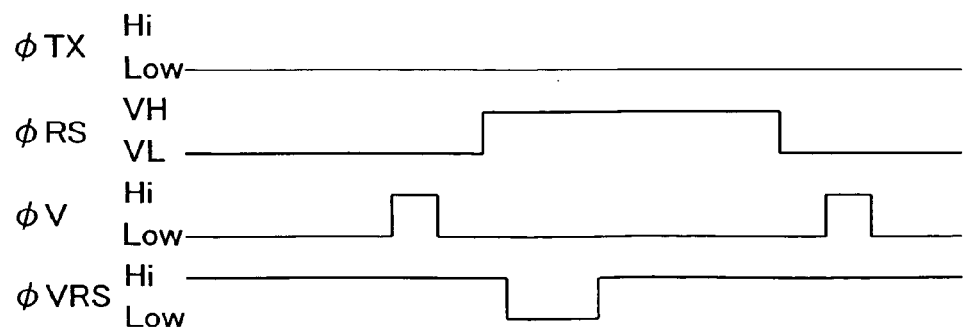
Figure 23A:
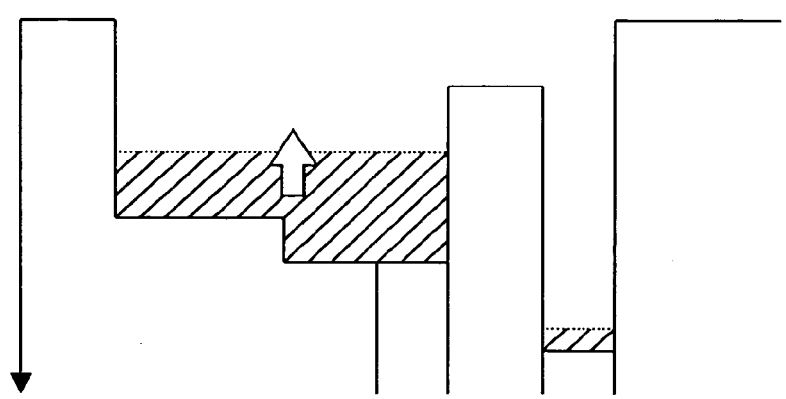
FIGS. 23A to 23C are diagrams showing the potential states of individual channels in the pixel shown in FIG. 21.
Figure 23B:
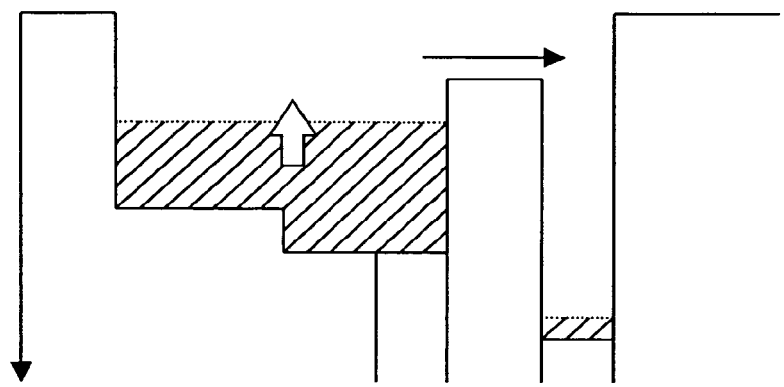
Figure 23C:
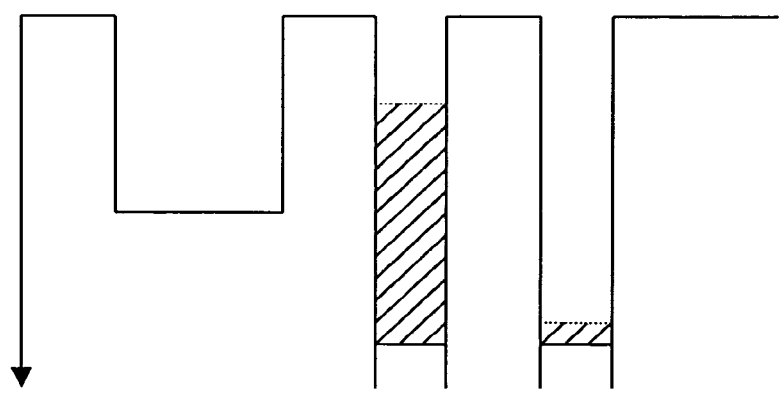

An example of the operation of the pixel configured as shown in FIG. 21 will be described below with reference to FIGS. 22A, 22B, and 23A to 23C. FIGS. 22A and 22B are timing charts showing the states of relevant signals in the solid-state image-sensing device of this embodiment, illustrating an example of the operation thereof FIGS. 23A to 23C are diagrams showing the potential states of individual channels in the pixel of this embodiment. In this example of operation, a global shutter method is adopted, whereby exposure is performed simultaneously for all the pixels of one entire frame.

First, with reference to FIG. 22A, the level shifts of relevant signals as observed when image sensing is performed in all the pixels during a vertical blanking period will be described. Here, the signals φRS, φVRS, and φTX are fed with identical timing as shown in FIG. 22A to all the pixels provided in the solid-state image-sensing device. First, the level of the signal φTX is turned low, and the level of the signal φRS is turned to VL to turn the MOS transistors T1 and T2 off. Then, the signal φVRS is turned high so that a voltage nearly equal to the direct-current voltage VPD is fed to the drain of the MOS transistor T2.

Then, the level of the signal φRS is turned to VH to turn the MOS transistor T2 on, and then the signal φTX is turned high to turn the MOS transistor T1 on. Here, when the level of the φRS is turned to VH and the MOS transistor T2 is thereby turned on, the MOS transistor T2 is brought into a conducting state. Thereafter, the signal φVRS is turned low so that electric charge is accumulated in the buried photodiode PD and the N-type floating diffusion layer FD. This forces the potentials at the buried photodiode PD and the N-type floating diffusion layer FD to become equal to values (hereinafter the "white level values") equivalent to those observed when the incident light has the maximum brightness.

Thereafter, the signal φVRS is turned high to initialize, via the transfer gate TG and the reset gate RG, which are the gate regions of the MOS transistors T1 and T2, the potentials at the buried photodiode PD and the N-type floating diffusion layer FD so that the potentials become equal to values (hereinafter the "black level values") equivalent to those observed when no light is incident. Then, the level of the signal φRS is turned to VM to lower the potential at the reset gate RG. Specifically, as shown in FIG. 23A, the potential at the reset gate RG is made lower than the potentials at the buried photodiode PD, the transfer gate TG, and the N-type floating diffusion layer FD.

As a result, when the brightness of the subject is low, the photoelectric charge generated in the buried photodiode PD is accumulated in the buried photodiode PD, the transfer gate TG, and the N-type floating diffusion layer FD, so that the potentials at the buried photodiode PD, the transfer gate TG, and the N-type floating diffusion layer FD lower. Here, the photoelectric charge generated in the buried photodiode PD remains there by being accumulated therein, and thus the potential at the N-type floating diffusion layer FD varies in linear proportion to the integral of the amount of incident light. By contrast, when the brightness of the subject is high, the potential at the N-type floating diffusion layer FD lowers and, when its difference from the potential at the reset gate RG becomes close to the threshold value, then, as shown in FIG. 23B, the MOS transistor T2 operates in a subthreshold region, permitting a current to flow through the reset gate RG. Thus, the potential at the N-type floating diffusion layer FD varies in proportion to the logarithm of the current generated as a result of photoelectric conversion.

After, in this way, photoelectric conversion is performed in the buried photodiode PD, and the potential at the N-type floating diffusion layer FD varies linearly or natural logarithmically according to the amount of incident light, then the signal φTX is turned low and the level of the signal φRS is turned to VL. This lowers the potentials at the transfer gate TG and the reset gate RG as shown in FIG. 23C, and thus a potential commensurate with the amount of incident light is held in the N-type floating diffusion layer FD.

After image sensing is performed in all the pixels during a vertical blanking period in this way, with the result that, as shown in FIG. 23C, a potential commensurate with the amount of incident light is held in the N-type floating diffusion layer FD, then the levels of the signals φRS, φVRS, and φV, which are fed to one row after another of the solid-state image-sensing device, are shifted as shown in FIG. 22B during every horizontal blanking period, so that image signals and noise signals are outputted sequentially with respect to one row after another. Here, when the image signals and noise signals are red out, the signal φTX is kept low. That is, first, a high-level pulse is fed, as the signal φV, to the gate of the MOS transistor T4 so that a voltage signal commensurate with the amount of incident light is outputted, as an image signal, to the output signal line 4. Here, the signal φVRS is kept high until the signal φV is turned high, and the signal φRS is kept at VL.

Thereafter, the signal φV is turned low, and the level of the signal φRS is turned to VH to bring the MOS transistor T2 into a conducting state. Then, the signal φRS is turned low to force the potentials at the buried photodiode PD and the N-type floating diffusion layer FD to become equal to their white level values. Then, the signal φVRS is turned high again so that the electric charge accumulated in the N-type floating diffusion layer FD is recombined and thereby the potential at the N-type floating diffusion layer FD is initialized. After the potential at the N-type floating diffusion layer FD is initialized in this way, then the signal φRS is turned low, and then a pulse signal φV is fed to the MOS transistor T4 to turn it on, so that a voltage signal commensurate with the initialized potential at the N-type floating diffusion layer FD is outputted, as a noise signal, to output signal line 4.

As described above, in this embodiment, as against the first and second embodiments, it is according to the level VM of the signal φRS, which is fed to the gate of the MOS transistor T2, that the type of photoelectric conversion is determined that is performed to generate an electric signal commensurate with the amount of incident light. Moreover, as in the first and second embodiments, by switching this signal φRS, which is fed to the gate of the MOS transistor T2, among three levels, it is possible to achieve simultaneous shuttering with a circuit configuration similar to that of a conventional solid-state image-sensing device that performs linear conversion.

In a solid-state image-sensing device having pixels configured as in this embodiment and hence as shown in FIG. 21, the signal φTX, which is fed to the transfer gate TG, may be switched among three levels as in the second or third embodiments. Now, examples of the operation performed in each pixel in such a case, for example when the signal φTX is switched among three levels VHx, VM, and VL as in the third embodiment, will be described below. The examples of operation described below adopt three different methods, namely a rolling shutter method, a global shutter method, and a global reset method, respectively. In the following description of the different examples of operation, no detailed explanations will be given to such features as are found also in the third embodiment.

1. First Example of Operation

Figure 24:
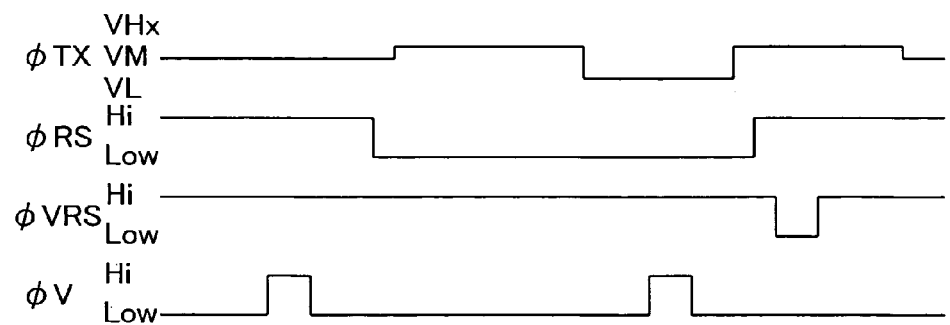
FIG. 24 is a timing chart showing the states of relevant signals in the solid-state image-sensing device of the third embodiment as observed when the pixel thereof is configured as shown in FIG. 21, illustrating a first example of the operation of the pixel thereof.

FIG. 24 is a timing chart showing a first example of operation in the example under discussion. As in the third embodiment, when the level of the signal φTX is turned to VM, image sensing is performed in the buried photodiode PD. Here, with the signal φRS high and the MOS transistor T2 on, when the signal φV is turned high to turn the MOS transistor T4 on, a noise signal is outputted. Here, while image sensing is being performed in the buried photodiode PD and a noise signal is being outputted, the signal φVRS, which is fed to the drain of the MOS transistor T2, is kept high.

Then, the signal φRS is turned low, and then the level of the signal φTX is turned to VHx so that the photoelectric charge accumulated in the buried photodiode PD is transferred to the transfer gate TG. After, in this way, the potential at the transfer gate TG is made equal to a potential commensurate with the amount of light incident on the buried photodiode PD, then the level of the signal φTX is turned to VL, and then the pulse signal φV is turned high, so that an image signal is outputted.

After the image signal is outputted, as against the third embodiment, the level of the signal φTX is turned to VHx, and the signal φRS is turned high. Thereafter, the signal φVRS is turned low to accumulate electric charge in the buried photodiode PD and the N-type floating diffusion layer FD and thereby force the potential in the buried photodiode PD to become equal to its white level value. Then, the signal φVRS is turned high to initialize the potential at the buried photodiode PD and thereby make it equal to its black level value. Then, the level of the signal φTX is turned to VM so that image sensing is started in the buried photodiode PD.

2. Second Example of Operation

Figure 25A:
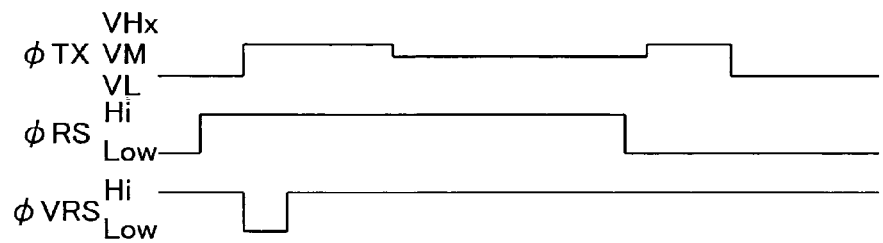
FIGS. 25A and 25B are timing charts showing the states of relevant signals in the solid-state image-sensing device of the third embodiment as observed when the pixel thereof is configured as shown in FIG. 21, illustrating a second example of the operation of the pixel thereof.
Figure 25B:
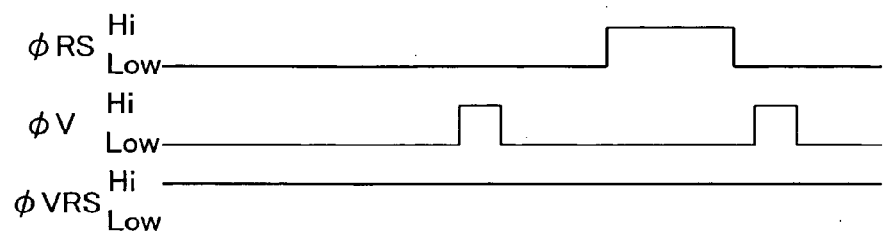

FIGS. 25A and 25B are timing charts showing a second example of operation in the example under discussion. As in the third embodiment, when the level of the signal φTX is turned to VM, image sensing is performed in the buried photodiode PD. When image sensing is performed simultaneously in all the pixels during a vertical blanking period as shown in FIG. 25A, with the signal φVRS high, the signal φRS is turned from low to high, and then the level of the signal φTX is turned from VL to VHx. Thereafter, first, the signal φVRS is turned low to force the potential at the buried photodiode PD to become equal to its white level value. Then, while the level of the signal φTX is kept at VHx and the signal φRS is kept high, the signal φVRS is turned high to initialize the potential at the buried photodiode PD and thereby make it equal to its black level value.

Thereafter, the level of the signal φTX is turned to VM so that the buried photodiode PD performs image sensing, and then the signal φRS is turned low. Then, the level of the signal φTX is turned to VHx so that the photoelectric charge accumulated in the buried photodiode PD is transferred to the N-type floating diffusion layer FD. Then, the level of the signal φTX is turned to VL so that transfer to the N-type floating diffusion layer FD is ended. Thereafter, the levels of the signals φRS and φV are shifted with the timing shown in FIG. 25B, i.e., with the same timing as shown in FIG. 18B in the third embodiment, and the signal φVRS is kept high so that, during every horizontal blanking period, image signals and noise signals are outputted from the solid-state image-sensing device sequentially with respect to one row after another.

3. Third Example of Operation

Figure 26A:
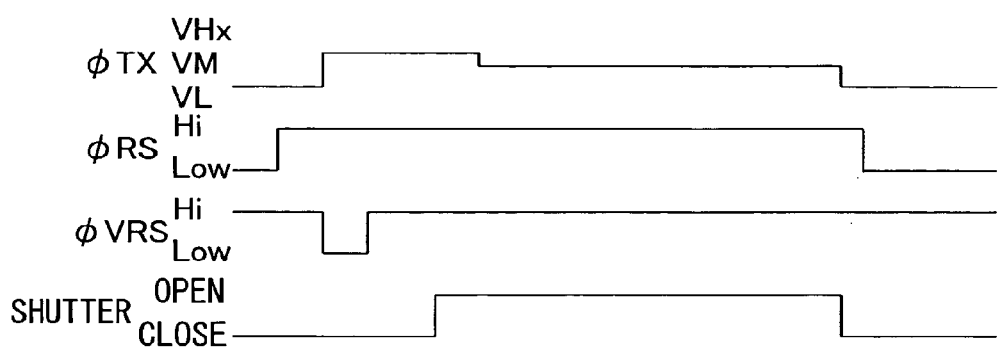
FIGS. 26A and 26B are timing charts showing the states of relevant signals in the solid-state image-sensing device of the third embodiment as observed when the pixel thereof is configured as shown in FIG. 21, illustrating a third example of the operation of the pixel thereof.
Figure 26B:
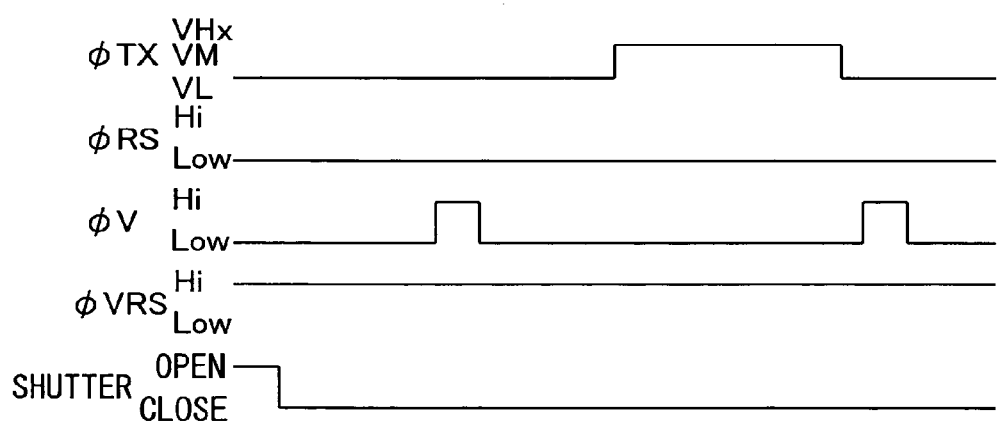

FIGS. 26A and 26B are timing charts showing a third example of operation in the example under discussion. As in the third embodiment, when the level of the signal φTX is turned to VM, image sensing is performed in the buried photodiode PD. When image sensing is performed simultaneously in all the pixels during a vertical blanking period as shown in FIG. 26A, with the signal φVRS high, the signal φRS is turned from low to high, and then the level of the signal φTX is turned from VL to VHx. Thereafter, as in the second example of operation, first, the signal φVRS is turned low to force the potential at the buried photodiode PD to become equal to its white level value, and then the signal φVRS is turned high to make the potential at the buried photodiode PD equal to its black level value.

Then, the level of the signal φTX is turned to VM, and the shutter is released so that image sensing is performed in the buried photodiode PD. Then, the level of the signal φTX is turned to VL, and the shutter is closed so that image sensing is ended. Then, the signal φRS is turned low. Thereafter, the levels of the signals φRS, φTX, and φV are shifted with the timing shown in FIG. 26B, i.e., with the same timing as shown in FIG. 20B in the third embodiment, and the signal φVRS is kept high so that, during every horizontal blanking period, image signals and noise signals are outputted from the solid-state image-sensing device sequentially with respect to one row after another.

In this solid-state image-sensing device, of which each pixel is configured as shown in FIG. 21, the signal φTX may be a ternary voltage switched among three levels VHx, VM, and VL as in the third embodiment as specifically described above, or may be a ternary voltage switched among three levels VH, VM, and VL as in the second embodiment. Even in that case, when the signal φTX is at VH and the signal φRS is high, by turning the signal φVRS first low and then high, the potential state of the buried photodiode PD is forced to become equal to its white level value and then equal to its black level value before image sensing. In this way, the potential state of the buried photodiode PD of each pixel can always be reset to an identical potential state before image sensing is started.

The embodiments described above all deal with cases where the MOS transistors T1 to T5 are all built as N-channel MOS transistors. When the MOS transistors T1 to T5 are all built as N-channel transistors in this way, they are formed in a P-type well layer or in a P-type substrate.

Figure 27:
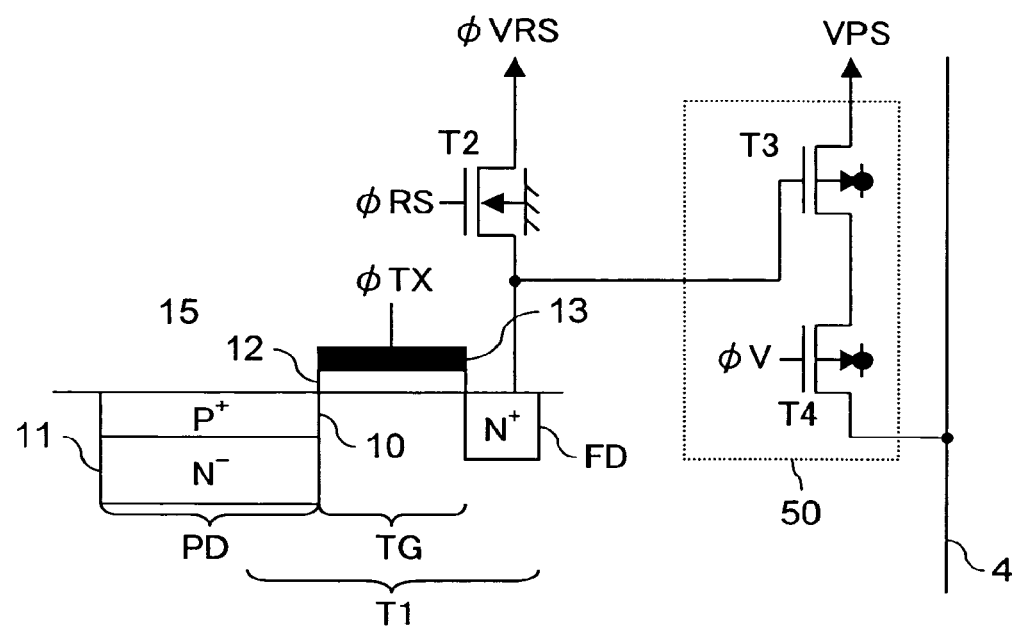
FIG. 27 is a diagram showing another example of the configuration of each pixel provided in the solid-state image-sensing device.

In any of the embodiments, while the MOS transistors T1, T2, and T5 are built as N-channel MOS transistors, the MOS transistors T3 and T4 may be built as P-channel MOS transistors. In such a case, for example when each pixel is built with MOS transistors T1 to T4 (corresponding to the pixel configuration of the second embodiment) as shown in FIG. 27, the MOS transistors T3 ad T4, which are built as P-channel MOS transistors, may be formed in an N-type well layer 50. The MOS transistor T3 built as a P-channel MOS transistor then receives, at the drain thereof, the direct-current voltage VPS.

What is claimed is:

1. A solid state image sensing device comprising:
   a plurality of pixels, each pixel including:
      a buried photodiode that generates and accumulates therewithin a photoelectric charge commensurate with an amount of incident light;
      a transfer gate that transfers the photoelectric charge accumulated in the buried photodiode;
      a floating diffusion layer that accumulates therewithin the photoelectric charge transferred from the buried photodiode via the transfer gate;
      a reset gate that is electrically connected to the floating diffusion layer to reset the floating diffusion layer;
      an amplifier that is electrically connected to the floating diffusion layer;
      a read-out switch for reading out an output signal amplified by the amplifier; and
      a transistor that has the transfer gate as a control electrode, that has the floating diffusion layer as a first electrode, and that has the buried photodiode as a second electrode;
   a first voltage application circuit that applies to the transfer gate a voltage switched among a first, a second, and a third voltage, the first voltage bringing the transistor into a non-conducting state, the third voltage bringing the transistor into a conducting state, the second voltage lying between the first and third voltage; and
   a second voltage application circuit that causes the reset gate to be in an on state or in an off state,
   wherein
      when the reset gate is in the on state, the first voltage application circuit applies the second voltage to the transfer gate so that the photoelectric charge commensurate with the amount of incident light is accumulated within the buried photodiode, and that the transistor operates in a subthreshold region at least in part of a brightness range of the light incident on the buried photodiode to make the buried photodiode and the transistor perform linear photoelectric conversion under a predetermined amount of incident light and logarithmic photoelectric conversion at or over the predetermined amount of incident light,
      when the reset gate is in the off state, the first voltage application circuit applies the third voltage to the transfer gate to transfer the photoelectric charge accumulated in the buried photodiode to the floating diffusion layer,
      when the reset gate is in the off state, the first voltage application circuit applies the first voltage to the transfer gate to inhibit transfer of the photoelectric charge from the buried photodiode, and a voltage signal commensurate with the photoelectric charge transferred to the floating diffusion layer is outputted, and
      during an entire time period between accumulation of the photoelectric charge in the buried photodiode under application of the second voltage to the transfer gate and until a beginning of output of the voltage signal, the reset gate is switched once from the on state to the off state and is kept in the off state by the second voltage application circuit.

2. A method of operating a solid state image sensing device comprising a plurality of pixels, wherein each pixel comprises:
   a buried photodiode that generates and accumulates therewithin a photoelectric charge commensurate with an amount of incident light;

a transfer gate that transfers the photoelectric charge accumulated in the buried photodiode;

a floating diffusion layer that accumulates therewithin the photoelectric charge transferred from the buried photodiode via the transfer gate;

a reset gate that is electrically connected to the floating diffusion layer to reset the floating diffusion layer;

an amplifier that is electrically connected to the floating diffusion layer;

a read-out switch for reading out an output signal amplified by the amplifier; and a transistor that has the transfer gate as a control electrode, that has the floating diffusion layer as a first electrode, and that has the buried photodiode as a second electrode;

a first voltage application circuit that applies to the transfer gate a voltage switched among a first, a second, and a third voltage, the first voltage bringing the transistor into a non-conducting state, the third voltage bringing the transistor into a conducting state, the second voltage lying between the first and third voltage; and a second voltage application circuit that causes the reset gate to be in an on state or in an off state, the method comprising the following steps:

applying the second voltage to the transfer gate while the reset gate is in the on state, so that the photoelectric charge commensurate with the amount of incident light is accumulated within the buried photodiode, and that the transistor operates in a subthreshold region at least in part of a brightness range of the light incident on the buried photodiode to make the buried photodiode and the transistor perform linear photoelectric conversion under a predetermined amount of incident light and logarithmic photoelectric conversion at or over the predetermined amount of incident light;

applying the third voltage to the transfer gate to transfer the photoelectric charge accumulated in the buried photodiode to the floating diffusion layer while the reset gate is in the off state;

applying the first voltage to the transfer gate to inhibit transfer of the photoelectric charge from the buried photodiode; and outputting a voltage signal commensurate with the photoelectric charge transferred to the floating diffusion layer, wherein, during an entire time period between accumulation of the photoelectric charge in the buried photodiode under application of the second voltage to the transfer gate and until a beginning of output of the voltage signal, the reset gate is switched once from the on state to the off state and is kept in the off state.

\* \* \* \* \*